United States Patent [19]

Rakers et al.

[11] Patent Number: 5,644,313

[45] Date of Patent: Jul. 1, 1997

[54] REDUNDANT SIGNED DIGIT A-TO-D CONVERSION CIRCUIT AND METHOD THEREOF

[75] Inventors: Patrick L. Rakers, Schaumburg, Ill.; Douglas A. Garrity, Gilbert, Ariz.

[73] Assignee: Motorola, Inc., Schaumburg, Ill.

[21] Appl. No.: 463,818

[22] Filed: Jun. 5, 1995

[51] Int. Cl.$^6$ .................................................. H03M 1/40
[52] U.S. Cl. .......................... 341/163; 341/161; 341/162
[58] Field of Search ................................ 341/161, 162, 341/163

[56] References Cited

U.S. PATENT DOCUMENTS

| | | |
|---|---|---|
| 3,819,919 | 6/1974 | McGunigle . |
| 4,544,962 | 10/1985 | Kato et al. . |
| 4,607,345 | 8/1986 | Mehta . |
| 4,691,190 | 9/1987 | Robinson . |
| 4,792,787 | 12/1988 | Speiser et al. . |
| 5,017,920 | 5/1991 | French ................................ 341/163 |
| 5,327,129 | 7/1994 | Soenen et al. ..................... 341/120 |
| 5,499,027 | 3/1996 | Karanicolas et al. .............. 341/120 |

OTHER PUBLICATIONS

"A 12 Bit 600kS/s Digitally Self–calibrated Pipeline Algorithmic ADC," by H. Lee, published in Dept. of EECS, Massachusetts Institute of Technology, pp. 121–122. (no date given).

"A CMOS 13–b Cyclic RSD A/D Converter," by B. Ginetti et al., published in the IEEE Journal of Solid–State Circuits, vol. 27, No. 7, Jul. 1992, pp. 957–965.

*Primary Examiner*—Jeffrey A. Gaffin
*Assistant Examiner*—Thuy-Trang N. Huynh
*Attorney, Agent, or Firm*—Robert D. Atkins

[57] ABSTRACT

RSD n-bit analog-to-digital converter (10) receives voltage VIN that is compared to reference voltages VH and VL in the first stage (18). A digital code, representing VIN, is generated at first stage outputs (24, 26). First stage residue voltage V22 is compared to VH and VL in the second stage (30). A digital code generated at the outputs (28, 32) of the second stage, represent residue voltage V22. Residue voltage V22 is recycled through the first and second stages. Upon reaching the $n^{th}$ conversion bit, residue voltage V22 of the $n^{th}-1$ bit is compared to second stage mid-level voltage reference VMID. A digital code generated at the outputs of the second stage represents the $n^{th}-1$ bit residue voltage V22. The digital codes are stored in storage elements (34) and added in a binary adder (38) to provide the n-bit representation of VIN.

22 Claims, 9 Drawing Sheets

FIG. 6 — 170

| INPUT VOLTAGE | BIT 1 | BIT 0 | SWITCH 80 | SWITCH 82 | NODE 22 |
|---|---|---|---|---|---|
| VIN>VH | 1 | 0 | CLOSED | OPEN | (2 X VIN) − VREF |
| VL<VIN<VH | 0 | 1 | OPEN | OPEN | 2 X VIN |
| VIN<VL | 0 | 0 | OPEN | CLOSED | (2 X VIN) + VREF |

FIG. 8 — 172

| INPUT VOLTAGE | BIT 1 | BIT 0 | SWITCH 90 | SWITCH 92 | NODE 14 |
|---|---|---|---|---|---|
| MSB: | | | | | |
| V22>VH | 1 | 0 | CLOSED | OPEN | (2 X V22) − VREF |
| VL<V22<VH | 0 | 1 | OPEN | OPEN | 2 X V22 |
| V22<VL | 0 | 0 | OPEN | CLOSED | (2 X V22) + VREF |
| LSB: | | | | | |
| V22>VMID | 1 | X | X | OPEN | 2 X V22 |
| V22<VMID | 0 | X | X | OPEN | 2 X V22 |

REDUNDANT SIGNED DIGIT A-TO-D CONVERSION CIRCUIT AND METHOD THEREOF

CROSS REFERENCE TO RELATED PATENT APPLICATION

The present application is related to copending U.S. patent application Ser. No. 08/431,965, Attorney's Docket CR00072M, entitled "COMPARATOR CIRCUIT AND METHOD THEREOF", filed May 1, 1995, by Patrick L. Rakers et al and assigned to the same assignee, Motorola, Inc.

BACKGROUND OF THE INVENTION

The present invention relates in general to redundant signed digit (RSD) analog-to-digital converters and, more particularly, to a two stage cyclic analog-to-digital converter that exhibits a high degree of linearity by correctly determining the least significant bit.

In the past RSD analog-to-digital converters have been configured with an input track and hold and comparator circuit, followed by an RSD conversion stage. During a first clock phase, the track and hold and comparator circuit would acquire the voltage that was to be converted and compare the voltage to a high level reference voltage and to a low level reference voltage. The resulting logic signal would be stored in a serial storage register. During the following phase, the acquired voltage is processed by the RSD stage. A residue voltage, is generated in the RSD stage, that depends on the comparison results. The residue voltage is recycled through a feedback loop to the input of the track and hold and comparator circuit so as to repeat the conversion process until the remaining bits are determined. Thus, an n-bit RSD analog-to-digital converter requires n clock cycles to perform the n-bit conversion, and is thereby limited in conversion speed due to the large number of clock cycles required to complete a conversion.

Furthermore, present RSD analog-to-digital converters are subject to reduced linearity performance due to inaccurate determination of the least significant bit (lsb) of the conversion. If the voltage being compared for the lsb lies between the high and low level reference voltages, a linearity error is introduced in that the lsb must be forced into a logic high or logic low condition at the input to the storage register.

Hence, a need exists for a high-speed RSD analog-to-digital converter having a more accurately determined LSB.

BRIEF DESCRIPTION OF THE DRAWINGS

FIG. 6 is a table of functions of the operation of the first stage of the redundant signed digit analog-to-digital converter of FIG. 5;

FIG. 8 is a table of functions of the operation of the second stage of the redundant signed digit analog-to-digital converter of FIG. 7;

DETAILED DESCRIPTION OF THE PREFERRED EMBODIMENT

Figure 1:
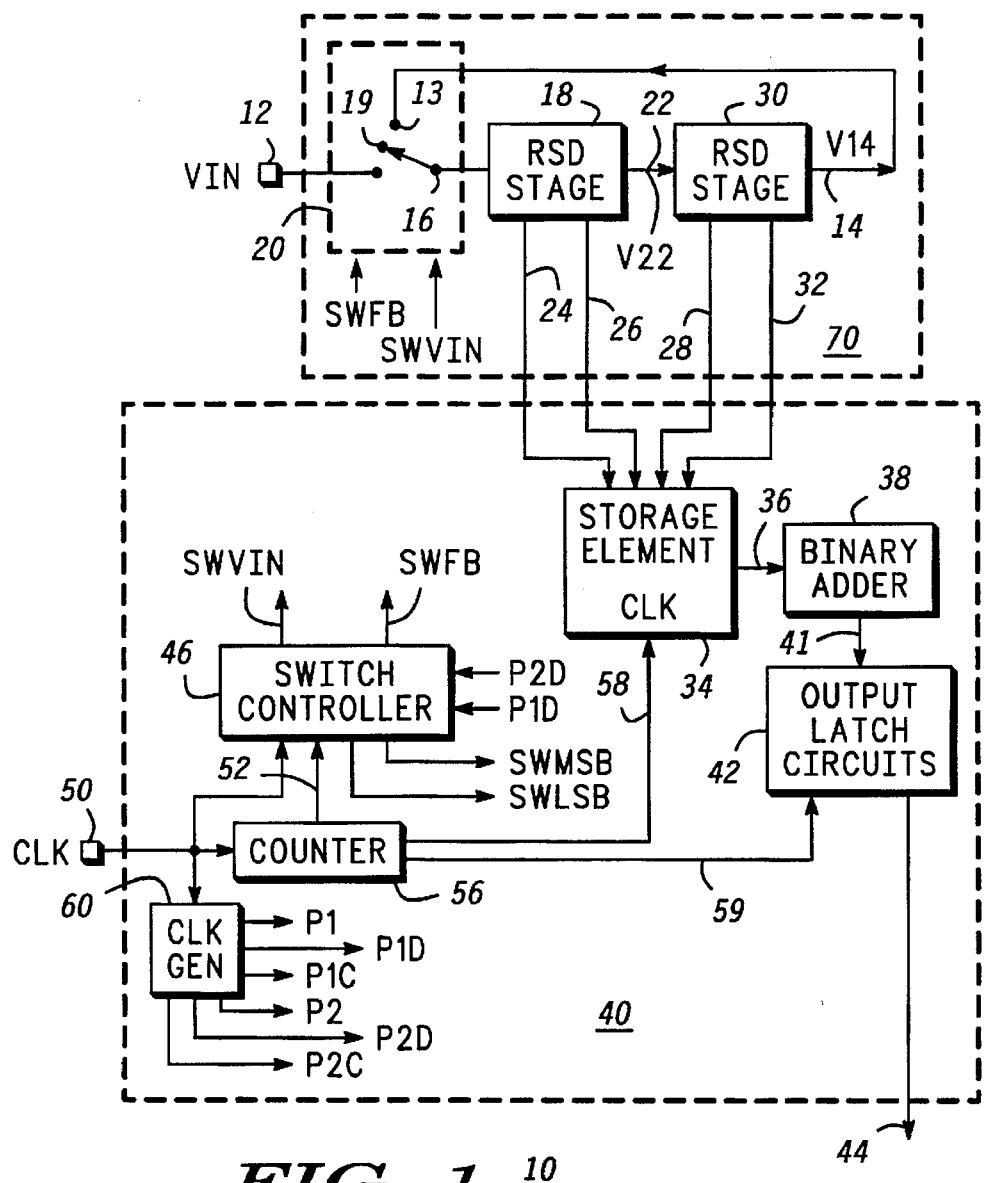
FIG. 1 is a block diagram illustrating a redundant signed digit analog-to-digital converter.

Referring to FIG. 1, redundant signed digit (RSD) analog-to-digital converter 10 is shown, suitable for manufacture as an integrated circuit. Analog section 70 receives signal VIN at node 12. VIN is coupled through input switch 20 to input node 16 of RSD stage 18. RSD stage 18 provides a residue voltage V22 at node 22 that is coupled to the input of RSD stage 30. RSD stage 30 provides a residue voltage V14 at node 14 that is coupled at node 13, through input switch 20, to the input of RSD stage 18. Input switch 20 operates between nodes 12 and 19 to sample input signal VIN. Input switch 20 further operates between nodes 19 and 13 to perform the RSD analog-to-digital conversion of VIN. Switch controller circuit 46 provides control signals SWVIN and SWFB to input switch 20. Control signals SWVIN and SWFB provide proper timing of the operation of input switch 20 in relation to the delay path for the analog-to-digital conversion. Switch controller 46 is coupled to receive master clock signal CLK at node 50. Additionally, switch controller 46 receives counter signal 52 and receives signals P2D and P1D from clock generator CLKGEN 60. Clock generator 60 generates a series of non-overlapping clock signals P1, P1D, P1C, P2, P2D, and P2C at its outputs.

Alternatively, a single control signal controls the state of input switch 20. The true and complement functions of a single control signal are generated with a time delay between the true and complement control signals to compensate for the delay path in the analog-to-digital conversion.

The operation of analog section 70 in converting the first two most significant bits, i.e., msb and msb-1, of a 10-bit analog-to-digital conversion proceeds as follows. A logic ONE SWVIN signal and a logic ZERO SWFB signal are applied to input switch 20, connecting a conduction path between node 12 and node 16 to sample and hold VIN at the input of RSD stage 18. Control signal SWVIN switches to a logic ZERO state and control signal SWFB remains at logic ZERO state, coupling input switch 20 between nodes 19 and 16. The path between node 12 and node 16 opens and the held signal VIN propagates into RSD stage 18. The digital output representation of the most significant bit is output to nodes 24 and 26 of RSD stage 18. A residue voltage is coupled from RSD stage 18, via node 22, to the input of RSD stage 30. The digital output representation of the next most significant bit, i.e., msb-1 is output to nodes 28 and 32 of RSD stage 30. The residue voltage from RSD stage 30 is output at node 14 and coupled to node 13 of input switch 20.

Logic circuit 40 includes storage element 34 that latches the logic data signal presented at nodes 24, 26, 28, and 32. Storage element 34 includes a number of storage latches. The number of storage latches required to latch the data presented by RSD stages 18 and 30 is shown in equation (1) as follows:

$$\text{storage latches} = 2n, \qquad (1)$$

where n is the number of output bits of analog-to-digital converter 10. For the present example, n is equal to 10 bits and 20 storage latches are required.

Counter 56 synchronizes the latching of the data into storage element 34 for further processing by binary adder 38. Master clock signal CLK drives counter 56 at node 50. The outputs of counter 56 are coupled through counter bit lines 58 to clock inputs of storage element 34. Five counter bit lines 58 are required for the present example of 10-bit analog-to-digital converter 10. The number of counter bit lines 58 required for an analog-to-digital conversion is given in equation (2), as follows:

$$C_{BITLINES} = \frac{n}{m},$$

where m is the number of RSD stages of analog-to-digital converter 10.

Binary adder 38 receives data output signals 36 of storage element 34. Binary adder 38 is an n-bit full binary adder and combines and correlates the 2n bits from storage element 34 and provides n bit output signals 41. Output latch circuits 42 latch n output signals 41 from binary adder 38. The signal on counter bit line 59 synchronizes the latching of output signals 41 into output latch circuits 42. For the present example, counter bit line 59 is one of counter bit line 58.

Returning now to the processing of the third and fourth bits, i.e., msb-2 and msb-3, in a 10-bit analog-to-digital conversion, the residue voltage V14 for the msb-1 conversion is returned to node 13 of input switch 20. A SWFB logic ONE signal is applied to input switch 20 while the SWVIN signal remains at a logic ZERO state. In response to the SWFB signal, input switch 20 connects a conduction path between nodes 13 and 16. The residue voltage V14 from the msb-1 bit is sampled and held at the input to RSD stage 18. Control signal SWFB returns to a logic ZERO state while control signal SWVIN remains at a logic ZERO state, thus severing the conduction path between node 13 and node 16. The digital output representation of the bit msb-2 is output to nodes 24 and 26. The residue voltage from bit msb-2 is coupled from RSD stage 18, via node 22, to the input of RSD stage 30. The digital output representation of bit msb-3 is output to nodes 28 and 32. The residue voltage of bit msb-3 from RSD stage 30 is output at node 14 and coupled to node 13 of input switch 20.

Processing the fifth and sixth bits, i.e., msb-4 and msb-5, in a 10-bit analog-to digital conversion, the residue voltage for V14 the msb-3 conversion is returned to node 13 of input switch 20. A SWFB logic ONE signal is applied to input switch 20 while the SWVIN signal remains at a logic ZERO state. In response to the SWFB signal, input switch 20 connects a conduction path between nodes 13 and 16. The residue voltage from the msb-3 bit is sampled and held at the input to RSD stage 18. Control signal SWFB returns to a logic ZERO state while control signal SWVIN remains at a logic ZERO state, thus severing the conduction path between node 13 and node 16. The digital output representation of the bit msb-4 is output to nodes 24 and 26. The residue voltage V22 from bit msb-4 is coupled from RSD stage 18, via node 22, to the input of RSD stage 30. The digital output representation of bit msb-5 is output to nodes 28 and 32. The residue voltage V14 of bit msb-5 from RSD stage 30 is output at node 14 and coupled to node 13 of input switch 20.

Processing the seventh and eighth bits, i.e., msb-6 and msb-7, in a 10-bit analog-to digital conversion, the residue voltage V14 for the msb-5 conversion is returned to node 13 of input switch 20. A SWFB logic ONE signal is applied to input switch 20 while the SWVIN signal remains at a logic ZERO state. In response to the SWFB signal, input switch 20 connects a conduction path between nodes 13 and 16. The residue voltage V14 from the msb-5 bit is sampled and held at the input to RSD stage 18. Control signal SWFB returns to a logic ZERO state while control signal SWVIN remains at a logic ZERO state, thus severing the conduction path between node 13 and node 16. The digital output representation of the bit msb-6 is output to nodes 24 and 26. The residue voltage V22 from bit msb-6 is coupled from RSD stage 18, via node 22, to the input of RSD stage 30. The digital output representation of bit msb-7 is output to nodes 28 and 32. The residue voltage of bit msb-7 from RSD stage 30 is output at node 14 and coupled to node 13 of input switch 20.

Processing the ninth and tenth bits, i.e., msb-8 and lsb, in a 10-bit analog-to digital conversion, the residue voltage V14 for the msb-7 conversion is returned to node 13 of input switch 20. A SWFB logic ONE signal is applied to input switch 20 while the SWVIN signal remains at a logic ZERO state. In response to the SWFB signal, input switch 20 connects a conduction path between nodes 13 and 16. The residue voltage V14 from the msb-7 bit is sampled and held at the input to RSD stage 18. Control signal SWFB returns to a logic ZERO state while control signal SWVIN remains at a logic ZERO state, thus severing the conduction path between node 13 and node 16. The digital output representation of the bit msb-8 is output to nodes 24 and 26. The residue voltage V22 from bit msb-8 is coupled from RSD stage 18, via node 22, to the input of RSD stage 30. The digital output representation of bit lsb is output to nodes 28 and 32. The processing of signal VIN by analog section 70 is complete. The digitally formatted conversion data from analog section 70 fills the twenty latches of storage element 34 of logic circuit 40. Data output signals 36 are transmitted to binary adder 38. Binary adder 38 converts 20 data output signals 36 to a 10-bit digital representation of input signal VIN. The 10-bit digital representation of input signal VIN is latched into output latch circuits 42, under control of counter signal 59, to provide a 10-bit analog-to-digital conversion of input signal VIN on output lines 44.

Figure 2:
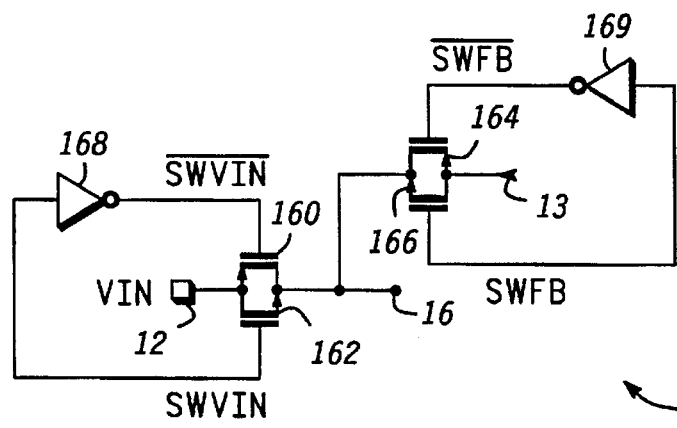
FIG. 2 is a schematic illustrating an input switch of the analog-to-digital converter of FIG. 1.

Referring to FIG. 2, further detail of input switch 20 is shown. N-channel transistor 162 and P-channel transistor 160 are coupled in a back-to-back configuration with the source and drain of transistor 160 coupled to the drain and source of transistor 162, respectively. The gate of transistor 160 is coupled to signal $\overline{\text{SWVIN}}$ and the gate of transistor 162 is coupled to signal SWVIN. Inverter 168 provides $\overline{\text{SWVIN}}$ as the inverse of SWIN. N-channel transistor 166 and P-channel transistor 164 are coupled in a back-to-back configuration with the source and drain of transistor 164 coupled to the drain and source of transistor 166, respectively. The gate of transistor 164 is coupled to signal $\overline{\text{SWFB}}$ and the gate of transistor 166 is coupled to signal SWFB. Inverter 169 provides $\overline{\text{SWFB}}$ as the inverse of SWFB.

The application of a logic ONE SWVIN signal, to transistors 160 and 162, couples signal VIN at node 12 to node 16. The application of a logic ZERO SWVIN signal, to transistors 160 and 162, presents an open circuit between node 12 and node 16. The application of a logic ONE SWFB signal, to transistors 164 and 166, couples the signal at node 14 to node 16. The application of a logic ZERO SWVIN signal, to transistors 164 and 166, presents an open circuit between node 14 and node 16.

Figure 3:
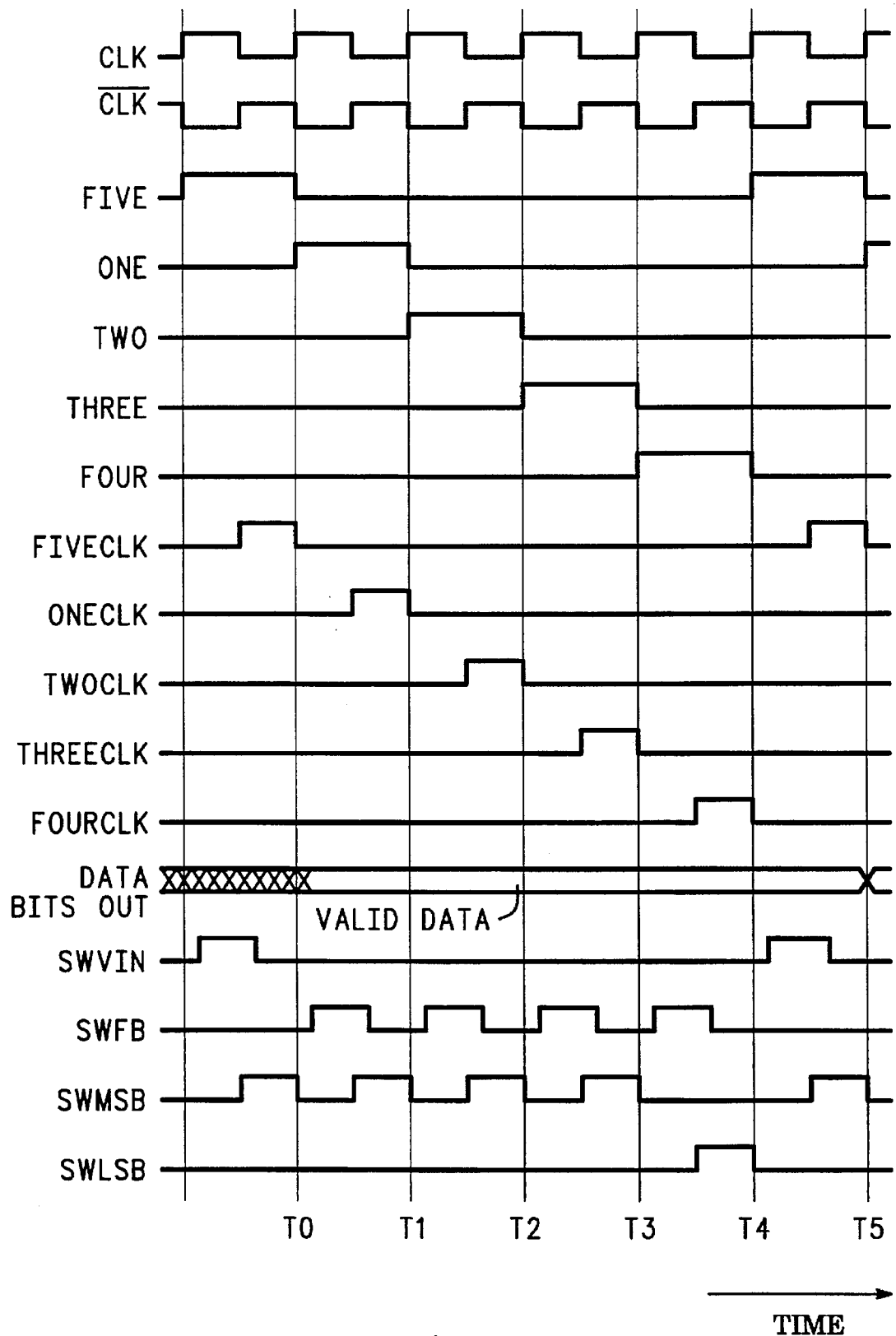
FIG. 3 is a table of control signals illustrating functional timing for the redundant signed digit analog-to-digital converter of FIG. 1.

Referring to FIG. 3, timing diagram 65 includes master clock CLK, switch controller 46, counter 56 signal waveforms, and valid data period waveforms. Control signals ONE, TWO, THREE, FOUR, and FIVE are provided at the output of counter 56. Counter 56 has n/2 outputs, where n is the number of bits required for the analog-to-digital conversion. For example, in a 10-bit analog-to-digital converter, counter 56 has five outputs.

Control signals ONECLK, TWOCLK, THREECLK, FOURCLK, and FIVECLK are derived by performing a logic AND operation of each of control signals ONE, TWO, THREE, FOUR, and FIVE, respectively, with the inverse of system clock $\overline{CLK}$ signal. Control signals ONECLK, TWOCLK, THREECLK, FOURCLK, and FIVECLK synchronize the input of data, at nodes 24, 26, 28, and 32, into storage element 34.

Figure 4:
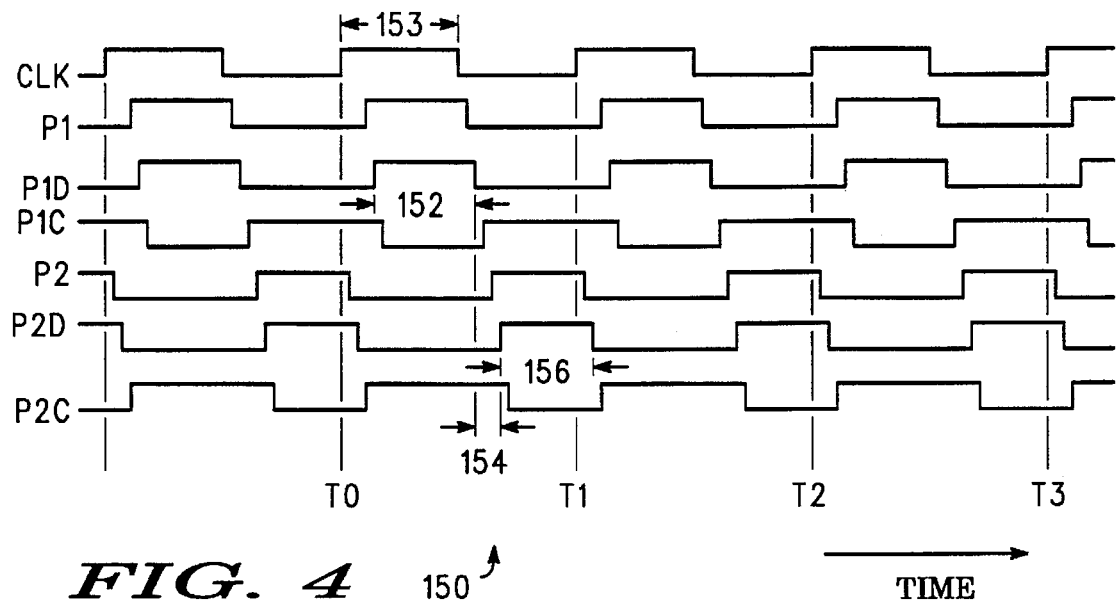
FIG. 4 is a table of non-overlapping control signals.

Switch controller signal SWVIN is derived by performing a logic AND operation of control signal FIVE with control signal P1D of FIG. 4. Switch controller signal SWFB is derived by performing a logic AND operation of control signal $\overline{FIVE}$ (not shown) with control signal P1D of FIG. 4. Switch controller signals SWVIN and SWFB control input switch 20.

Alternatively, the control signals described, once known, are equivalently generated by logic circuits using methods of logic generation known in the art.

Looking now to FIG. 4, timing relationship 150 of non-overlapping clock signals of clock generator 60 is shown. Control signals P1, P1C, P1D, P2, P2C, and P2D are generated from system master clock CLK using a non-overlapping clock generator 60. For example control signal P1C is derived from P1 control signal, and control signal P1D is derived from control signal P1C. Control signal P1D is a delayed replica of control signal P1. Control signal P2C is derived from P2 control signal, and control signal P2D is derived from control signal P2C. Control signal P2D is a delayed replica of control signal P2. The symbols P1, P1C, and P1D refer to phase ONE operation for the clock generator. The symbols P2, P2C, and P2D refer to phase TWO operation for the clock generator. Control signals P1, P1C, P1D, P2, P2C, and P2D are alternatively generated using equivalent logic circuits.

Figure 5:
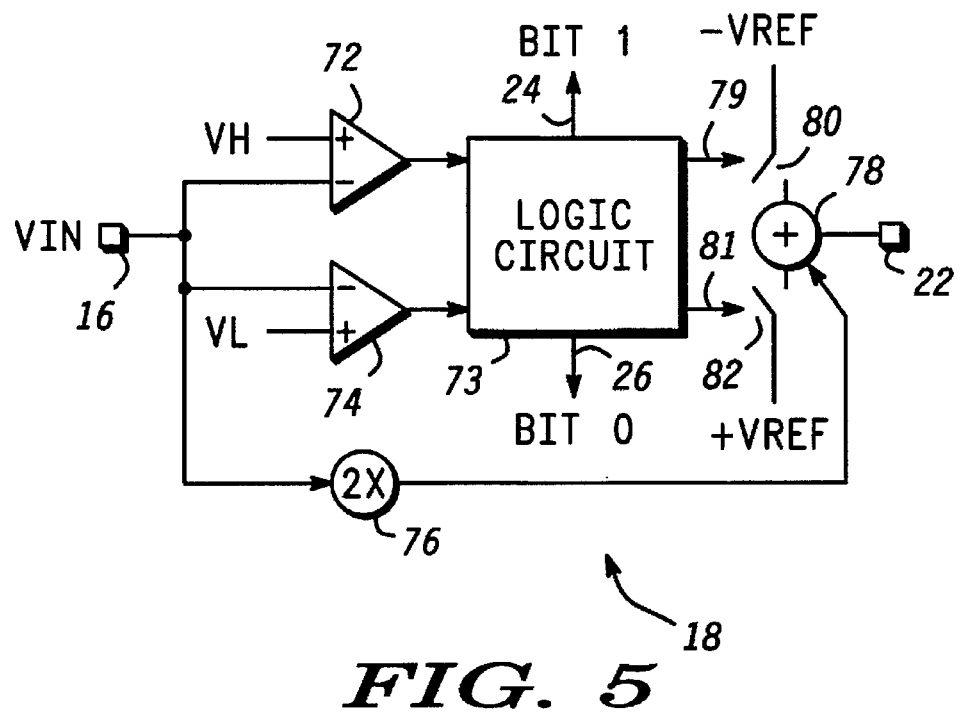
FIG. 5 is a schematic and block diagram illustrating a first stage of the redundant signed digit analog-to-digital converter of FIG. 1.

Referring to FIG. 5, details of RSD stage 18 are shown. For an input voltage range of VIN of −2.0 volts to +2.0 volts, reference voltages −VREF and +VREF are −2.0 volts and +2.0 volts, respectively. High level reference voltage VH is one-third of +VREF and low level reference voltage VL is one third of −VREF. The input voltage ranges and reference voltages used for VIN and VREF, respectively, are maintained within the limitations of the parametric constraints of the processes used to manufacture analog-to-digital converter 10. Input signal VIN is coupled to the input of multiplier circuit 76. The output of multiplier 76 is coupled to an input of summing circuit 78. The output of summing circuit 78 is coupled to node 22. Comparator 72 is coupled to receive reference voltage VH at its positive input node and further coupled to receive input signal VIN at its negative input node. The output of comparator 72 is coupled to an input of logic circuit 73. Logic circuit 73 provides data signal BIT1 coupled at its output to node 24. Data signal BIT1 is a digital representation of the analog input voltage applied at the input of comparator 72. Logic circuit 73 has a second output coupled at node 79 for controlling switch 80. Switch 80 is coupled between reference voltage −VREF and an input of summing circuit 78. Comparator 74 is coupled to receive reference voltage VL at its positive input node and further coupled to receive input signal VIN at its negative input node. The output of comparator 74 is coupled to another input of logic circuit 73. Another output of logic circuit 73 provides output data signal BIT0 coupled to node 26. Data signal BIT0 is a digital representation of the analog input voltage applied at the input of comparator 74. Logic circuit 73 has still another output coupled to node 81 for controlling switch 82. Switch 82 is coupled between reference voltage +VREF and an input of summing circuit 78.

Referring briefly to FIG. 6, table 170 provides the detailed operating conditions of RSD stage 18, for most significant bit msb conversions of an analog input signal to a BIT0 and BIT1 digital representation of the analog input signal. BIT0 and BIT1 provide a digital code representation of the analog input voltage. Table 170 also illustrates the states of switches 80 and 82, respectively, corresponding to the analog input signal. Table 170 additionally illustrates the residue voltage appearing at node 22 of the output of summing circuit 78. The circuitry for logic circuit 73 is derived knowing the conditions set forth in table 170.

Looking now to the operation of RSD stage 18 in FIG. 5, analog input voltage VIN is sampled at node 16. Voltage VIN is input to multiplier 76 and is multiplied by a factor of two. The voltage appearing at the output of multiplier 76 is equal to 2*VIN. The output of multiplier 76 is summed into summing circuit 78. Additionally, voltage VIN is compared to reference voltage VH of comparator 72 and compared to reference voltage VL of comparator 74. If, for example, voltage VIN is greater than reference voltage VH of comparator 72, data signal BIT1 of logic circuit 73 transitions to a logic ONE state at node 24. Node 79 is logic one and switch 80 closes, applying voltage −VREF to an input of summing circuit 78. Since voltage VIN is greater than reference voltage VH of comparator 72, voltage VIN correspondingly is greater than reference voltage VL of comparator 74, and data signal BIT0 of logic circuit 73 transitions to a logic ZERO state at node 26. Node 81 is logic zero and switch 82 is maintained in an open position. Thus, when input voltage VIN is greater than reference voltage VH, the output voltage of summing circuit 78, i.e., the output of RSD stage 18, is the voltage 2*VIN−VREF and that data signal BIT1 is set to a logic ONE and signal BIT0 is set to a logic ZERO.

Now, looking at an example where voltage VIN is less than reference voltage VL of comparator 74, voltage VIN is input to multiplier 76 and is multiplied by a factor of two. The voltage appearing at the output of multiplier 76 is equal to 2*VIN. Summing circuit 78 receives the output of multiplier 76. Additionally, voltage VIN is compared to reference voltage VH of comparator 72 and compared to reference voltage VL of comparator 74. Since voltage VIN is less than reference voltage VL of comparator 74, voltage VIN is also less than reference voltage VH of comparator 72. Data signal BIT1 of logic circuit 73 transitions to a logic ZERO state at node 24. Node 79 is logic zero and switch 80 is maintained in an open condition. Since voltage VIN is less than reference voltage VL of comparator 74, data signal BIT0 transitions to a logic ZERO at node 26. Node 81 is logic one and switch 82 closes whereby reference voltage +VREF is applied to an input of summing circuit 78. Thus, it can be appreciated that when input voltage VIN is less than reference voltage VL, the output voltage of summing circuit 78, i.e., the output of RSD stage 18, is the voltage 2*VIN+VREF and that data signal BIT1 is set to a logic ZERO and data signal BIT0 is set to a logic ZERO.

Now, looking at an example where voltage VIN is greater than reference voltage VL of comparator 74 and, at the same time, less than reference voltage VH of comparator 72, voltage VIN is input to multiplier 76 and is multiplied by a factor of two. The voltage appearing at the output of multiplier 76 is equal to 2*VIN. The output of multiplier 76 is input to summing circuit 78. Voltage VIN is compared to reference voltage VH of comparator 72 and compared to reference voltage VL of comparator 74. Data signal BIT1 of logic circuit 73 transitions to a logic ZERO state at node 24. Node 79 is logic zero and switch 80 is maintained in an open condition. Additionally, data signal BIT0 transitions to a logic ONE state at node 26. Node 81 is logic zero and switch 82 is maintained in an open condition. Therefore, only the voltage that was processed by multiplier 76 is forwarded through summing circuit 78. Thus, it can be appreciated that when input voltage VIN is less than reference voltage VH and, at the same time greater than reference voltage VL, the output voltage of summing circuit 78, i.e., the output of RSD stage 18, is the voltage 2*VIN and that data signal BIT1 is set to a logic ZERO and data signal BIT0 is set to a logic ONE.

It can be further appreciated that for RSD stage 18, data signal BIT1 is a digital representation of the analog input voltage applied at the input of comparator 72 and data signal BIT0 is a digital representation of the analog input voltage applied at the input of comparator 74.

Figure 7:
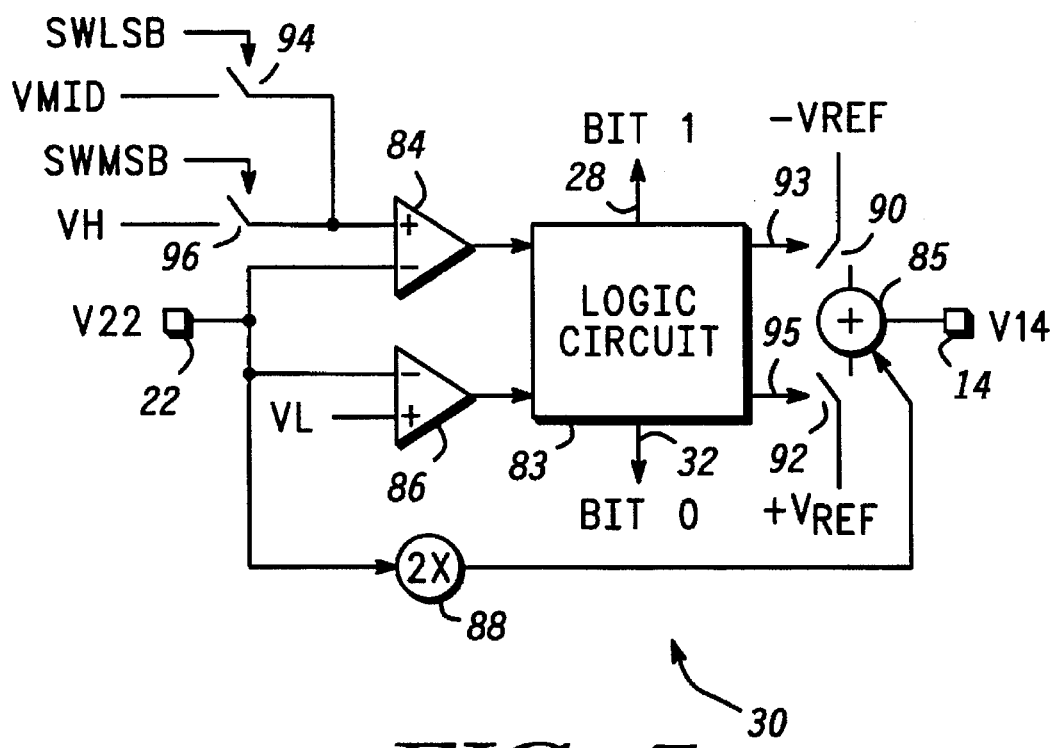
FIG. 7 is a schematic and block diagram illustrating a second stage of the redundant signed digit analog-to-digital converter of FIG. 1.

Referring to FIG. 7, details of RSD stage 30 are shown. The output voltage from RSD stage 18 is coupled to node 22 and serves as the input voltage to RSD stage 30. RSD stage 30 reference voltages −VREF and +VREF are −2.0 volts and +2.0 volts, respectively. High level reference voltage VH is one-third of +VREF and low level reference voltage VL is one third of −VREF. The reference voltages used for VREF, are maintained within the limitations of the parametric constraints of the processes used to manufacture analog-to-digital converter 10. Node 22 is coupled to the input of multiplier 88. The output of multiplier 88 is coupled to the input of summing circuit 85. The output of summing circuit 85 is coupled to node 14. The positive input node of comparator 84 is coupled, through MSB switch 96, to receive reference voltage VH, and coupled through LSB switch 94 to receive reference voltage VMID. VMID is a mid-level supply voltage that is typically the midpoint of the analog-to-digital power supply voltage or voltages. For the present example, VMID is 0.00 volts. Comparator 84 is further coupled to receive the residue voltage from node 22, at its negative input node. The output of comparator 84 is coupled to an input of logic circuit 83. Logic circuit 83 provides data signal BIT1 coupled at its output to node 28. Data signal BIT1 is a digital representation of the analog voltage applied at the input of comparator 84. Logic circuit 83 has a second output coupled at node 93 for controlling switch 90. Switch 90 is coupled between reference voltage −VREF and an input of summing circuit 85. Comparator 86 is coupled to receive reference voltage VL at its positive input node and further coupled to receive residue voltage V22 at its negative input node. The output of comparator 86 is coupled to another input of logic circuit 83. Another output of logic circuit 83 provides output data signal BIT0 coupled to node 32. Data signal BIT0 is a digital representation of the voltage applied at the node 22 input of comparator 86. Logic circuit 83 has still another output coupled to node 95 for controlling switch 92. Switch 92 is coupled between reference voltage +VREF and an input of summing circuit 85.

During operation, RSD stage 30 operates, selectively, between an MSB mode and an LSB mode. In the MSB mode, RSD stage 30 functions as described in table 172, FIG. 8. As shown in FIG. 8, BIT0 and BIT1 provide a digital code representation of residue voltage V22. Looking back to FIG. 7, switches 96 and 94 receive control signals SWMSB and SWLSB, respectively, from switch controller 46. In the MSB mode, switch 96 is closed, coupling reference voltage VH to the positive input of comparator 84. Switch 94 is open, preventing VMID from being coupled to the positive input of comparator 84. Alternatively, a single control signal is generated to control switches 94 and 96. In the MSB mode, RSD stage 30 functions in a similar manner to RSD stage 18, as described above for RSD stage 18 of FIG. 5.

After completion of processing of the most significant bits (msb) in RSD stage 18 and RSD stage 30, the least significant bit (lsb) is processed as follows. LSB switch 94 is closed and MSB switch 96 is opened by the application of the SWLSB and SWMSB control signals, respectively, from switch controller 46. Details of the switch control signals are shown in timing diagram 65 of FIG. 3. Thus, reference voltage VH is uncoupled from the positive input of comparator 84, and mid-reference voltage VMID is coupled to the positive input of comparator 84. RSD stage 30 is now prepared to compare residue voltage V22 to mid-supply reference voltage VMID.

An lsb conversion operation in RSD stage 30 proceeds as follows and as described in table 172 of FIG. 8. For example, if residue voltage V22 is greater than reference voltage VMID, data signal BIT1 is set to a logic ONE state, and BIT1 data is latched into storage element 34 of logic circuit 40. During an lsb conversion, switches 90 and 92 remain open. Residue voltage V22 is input to multiplier 88 and is multiplied by a factor of two. The residue voltage of RSD stage 30, at node 14, is 2*V22. During the lsb conversion, residue voltage V22 is also input to comparator 86, but the resulting data signal BIT0 is ignored for further processing by logic circuit 40.

If residue voltage V22 is less than reference voltage VMID, data signal BIT1 is set to a logic ZERO state and BIT1 data is latched into storage element 34 of logic circuit 40. Residue voltage V22 is input to multiplier 88 and is multiplied by a factor of two. The residue voltage of RSD stage 30, at node 14, is 2*V22. During the lsb conversion, residue voltage V22 is also input to comparator 86, but the resulting data signal BIT0, is ignored for further processing by logic circuit 40. Table 172 of FIG. 8 illustrates the detailed operating conditions of RSD stage 30, for msb and lsb conversions of an input signal. In table 172, X designates a logic don't care condition.

By now it can be appreciated, as an advantage of the present invention, that the switching of the reference comparison voltage in the second RSD stage of an RSD analog-to-digital converter, from a high level reference voltage VH and a low level reference voltage VL for an msb conversion, to a mid-level reference voltage VMID in an lsb conversion, provides for a more accurate lsb conversion. The lsb conversion accuracy is enhanced by eliminating the error introduced due to the non-resolution area that exists between voltage VH and voltage VL in the msb circuit.

Figure 9:
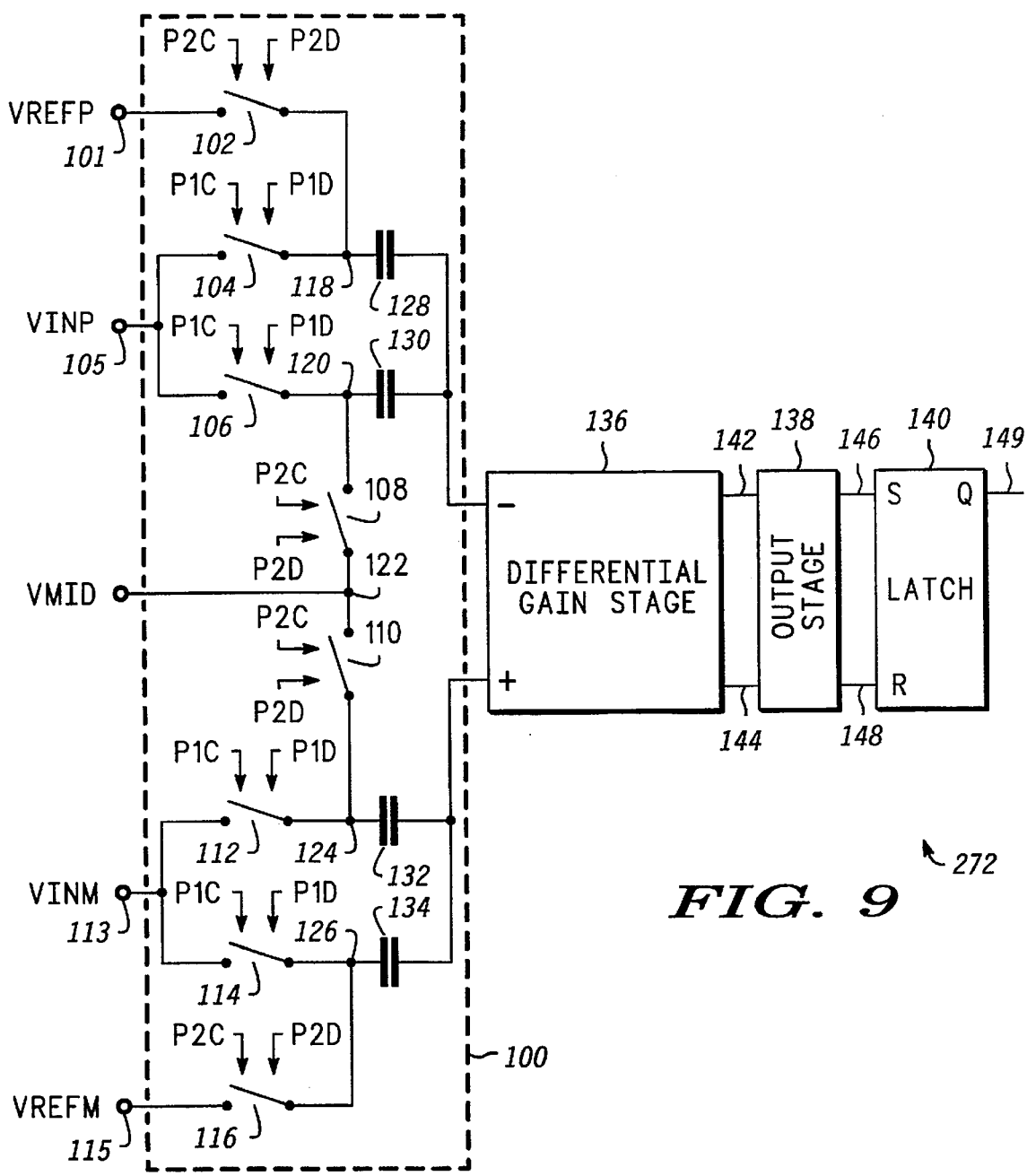
FIG. 9 is a schematic and block diagram illustrating a comparator of the redundant signed digit analog-to-digital converter of FIG. 1.

Referring to FIG. 9, comparator circuit 272 is shown. Comparator 272 is configured for differential operation. In an alternate embodiment of the present invention, comparator 272 is substituted for comparators 72, 74, 84, and 86 of FIG. 3. Comparator circuit 272 includes switched capacitor circuit 100 coupled to receive a differential signal at VINP and VINM nodes 105 and 113, respectively. Switched capacitor circuit 100 is further coupled to receive high VREFP and low VREFM reference signals at nodes 101 and 115, respectively. Mid-supply voltage VMID is applied to node 122 of switched capacitor circuit 100. The operation of comparator circuit 272 is constrained by the resultant limitations of wafer fabrication processing and physical dimensioning of the integrated circuit.

Switched capacitor circuit 100 is coupled across the positive and negative inputs of differential gain stage 136. An embodiment of gain stage 136 is disclosed in U.S. Pat. No. 4,710,724 and is hereby incorporated by reference. The differential output of gain stage 136 is coupled to the input nodes 142 and 144 of comparator output stage 138. The differential output of output stage 138 is coupled to S (SET) and R (RESET) inputs of SR latch 140. The Q-output of SR latch 140 is coupled to node 149. In an alternate embodiment of the present invention, an additional gain stage (not shown) is inserted between differential gain stage 136 and output stage 138 to provide a higher signal output level.

Reference signal VREFP is applied through switch 102 to node 118. Input signal VINP is applied through switches 104 and 106 to nodes 118 and 120, respectively. Capacitor 128 is coupled between the negative input of differential gain stats 136 and node 118 and operates as a charge storage element. Capacitor 130 is coupled between the negative input of differential gain stage 136 and node 120 and operates as a charge storage element. Mid-reference voltage supply VMID is coupled through switch 108 to node 120. Reference signal VREFM is coupled through switch 116 to node 126. Input signal VINM is coupled through switches 112 and 114 to nodes 124 and 126, respectively. Capacitor 132 is coupled between the positive input of differential gain stage 136 and node 124 and operates as a charge storage element. Capacitor 134 is coupled between the positive input of differential gain stage 136 and node 126 and operates as a charge storage element. Mid-reference voltage supply VMID is coupled through switch 110 to node 124.

Switches 102, 104, 106, 108, 110, 112, 114, and 116 are fabricated with n-channel and p-channel transistors (not shown) configured as CMOS transmission gates, with their drains and sources respectively coupled together. Control signal P1C controls the gate electrodes of p-channel transistors of switches 104, 106, 112, and 114. Control signal P1D controls the gate electrodes of n-channel transistors of switches 104, 106, 112, and 114. Control signal P2C controls the gate electrodes of p-channel transistors of switches 102, 108, 110, and 116. Control signal P2D controls the gate electrodes of n-channel transistors of switches 102, 108, 110, and 116.

Referring to FIG. 4, timing relationship 150 of control signals P1, P1C, P1D, P2, P2C, and P2D is shown. Control signals P1, P1C, P1D, P2, P2C, and P2D are generated from a system master clock CLK using a non-overlapping clock generator (not shown). For example control signal P1C is derived from P1 control signal, and control signal P1D is derived from control signal P1C. Control signal P1D is a delayed replica of control signal P1. Control signal P2C is derived from P2 control signal, and control signal P2D is derived from control signal P2C. Control signal P2D is a delayed replica of control signal P2. The resultant P1, P1C, P1D, P2, P2C, and P2D control signals ensure correct operation of comparator circuit 272. The symbols P1, P1C, and P1D refer to phase ONE operation for the clock generator. The symbols P2, P2C, and P2D refer to phase TWO operation for the clock generator. Control signals P1, P1C, P1D, P2, P2C, and P2D are alternatively generated using equivalent logic circuits. In an alternate embodiment of the present invention, switches 102, 104, 106, 108, 110, 112, 114, and 116 are fabricated as single transistors.

Switched capacitor circuit 100 is initialized by storing VREFP minus VMID across storage elements 128 and 130. Likewise, VREFM minus VMID is stored across storage elements 132 and 134. Input signal VINP is then sampled across storage element capacitors 128 and 130 and input signal VINM is sampled across storage element capacitors 132 and 134. The resulting output signal is the differential input signal, VINP minus VINM, minus the quotient of the differential reference signal, VREFP minus VREFM, and a constant, as shown in equation (3). The constant is a function of the ratio of storage elements, e.g., capacitors 130 and 128. The resulting signal is amplified by differential gain stage 136 to provide a comparison signal at input nodes 142 and 144.

Looking in more detail to the operation of switched capacitor circuit 100, just prior to time T0 of FIG. 4, control signal P2C is at a logic ZERO level and P2D is at a logic ONE level causing switches 102 and 108 to close. Control signal P1C is at a logic ONE level and control signal P1D is at a logic ZERO causing switches 104 and 106 to open. The inputs to differential gain stage 136 are shorted together. VREFP minus VMID is thus applied across capacitors 128 and 130. Similarly, switches 116 and 110 are closed, and switches 112 and 114 are open, applying VREFM minus VMID across capacitors 132 and 134. Just after time T0, in FIG. 4, CLK pulse 153 causes a transition of P1C to a logic ZERO and a corresponding P1D transition to a logic ONE, causing switches 104, 106, 112, and 114 to close. Control signal P2C is now at a logic ONE level and P2D is at a logic ZERO level causing switches 102, 108, 110, and 116 to open. VINP and VINM signals are applied to capacitors 128, 130 and 132, 134 respectively. During P1D pulse 152, the differential input voltage to the comparator is sampled and presented to the input of differential gain stage 136. The voltage signal VGSIN appearing at the input of gain stage 136, during pulse 152, is calculated as shown in equation (3) as follows, $$VGSIN = VIN - \frac{VREFP - VREFM}{1+d} \quad (3)$$

where VIN is the differential voltage appearing at the inputs of switched capacitor circuit 100, and 1-d is a constant, where the value of d is given in equation (4) as, $$d = \frac{\text{value of capacitor 130}}{\text{value of capacitor 128}}. \quad (4)$$

In FIG. 9, capacitor 128 is selected to be equal in value to capacitor 134. Likewise, capacitor 130 is selected to be equal in value to capacitor 132. For the present example, the values for capacitors 128 and 134 are each 0.5072 picofarads and capacitors 130 and 132 are each 1.0039 picofarads. Differential gain stage 136 provides an amplified signal at nodes 142 and 144 that is representative of the VGSIN input signal.

By now it can be appreciated that switched capacitor circuit 100 subtracts a reference voltage from an input signal voltage and compares the resultant difference signal voltage for determining the relative magnitude of the difference signal voltage. As an advantage of the present invention, switched capacitor circuit 100 is implemented with a minimal number of components and uses reference voltages for comparison that are derived from internal voltages.

After the completion of pulse 152 and prior to the transition to a logic ONE of P2D pulse 156, time period 154 allows output stage 138 to process the signal appearing at nodes 142 and 144 to provide an output signal at nodes 146 and 148. The signal appearing at nodes 146 and 148 latches into the S and R inputs, respectively, of SR latch 140. The signal remains latched until the next comparison process is initiated in comparator circuit 272 when P1C transitions to a logic ZERO and a correspondingly P1D transitions to a logic ONE.

In an alternate embodiment of the present invention, an intermediate gain stage (not shown) is inserted between differential gain stage 136 and output stage 138. The intermediate gain stage provides additional amplification of the signal presented to the input of differential gain stage 136. The requirement for use of an intermediate gain stage is dependent upon the amplitude of the signal to be processed by comparator circuit 272.

Figure 10:
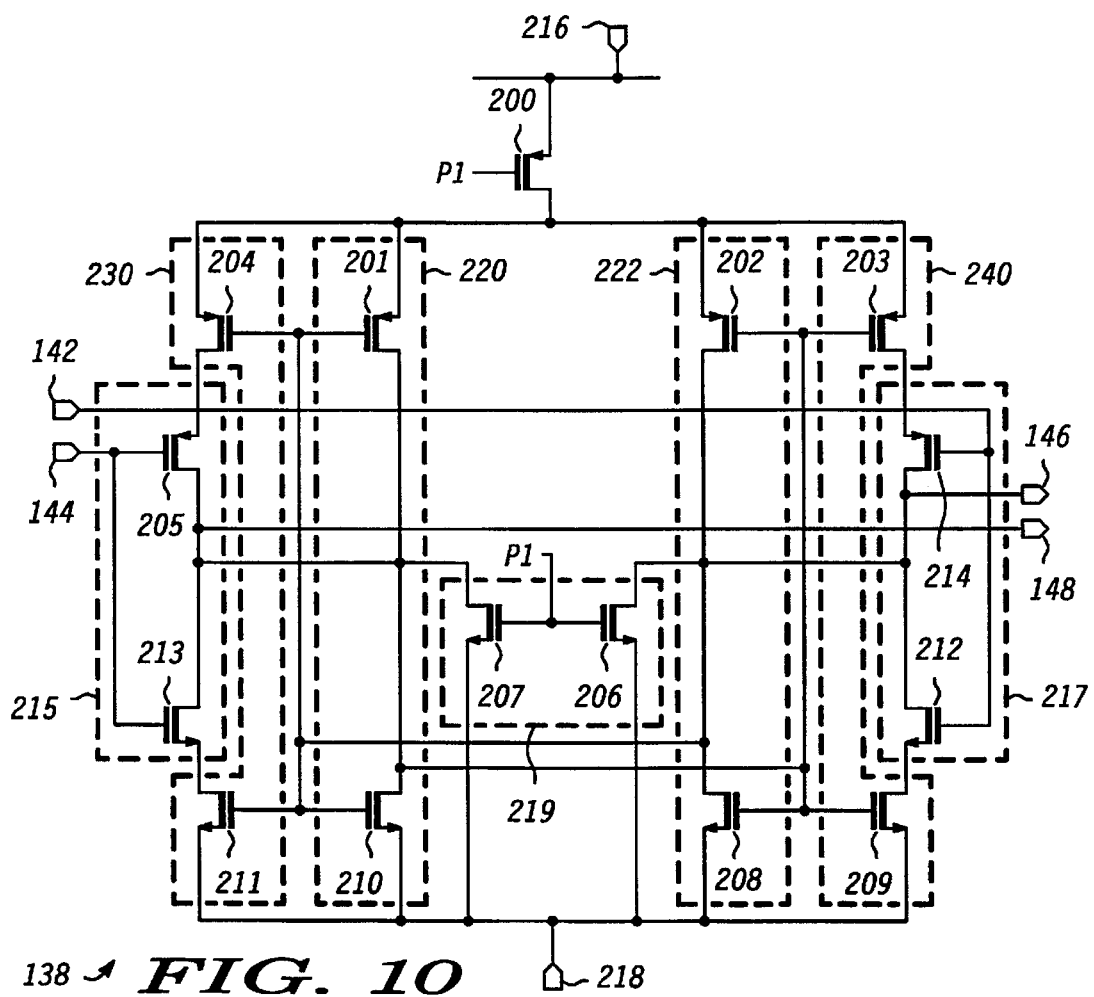
FIG. 10 is a schematic illustrating a zero current gain stage of the comparator of FIG. 9.

Referring now to FIG. 10, output stage 138 is coupled for receiving a differential signal at input nodes 142 and 144. Output stage 138 operates between power supply conductor VDD at node 216 and power supply conductor VSS at node 218. For the present example, VDD is 2.70 volts and VSS is at ground potential. The back gates of p-channel transistors 200, 201, 202, 203, 204, 205, and 214 are coupled to power supply conductor VDD. Output stage 138 provides an amplified output, at nodes 146 and 148, of the signal produced by differential gain stage 136.

Output stage 138 operates as follows. During the time period that control signal P1 is a logic ONE, the differential voltage appearing at the input to comparator circuit 272 is sampled by switched capacitor circuit 100 and compared to the difference of VREFP and VREFM, divided by a constant. The resultant voltage is amplified by differential gain stage circuit 136. The amplified signal is presented to input nodes 142 and 144 of output stage 138. In output stage 138 of FIG. 10, control signal P1 is coupled to the gate of p-channel transistor 200. During the time period when P1 is a logic ONE, transistor 200 is in an off state and current flow is interrupted between power supply conductor 216 and p-channel transistors 201, 202, 203, and 204.

Thus as an advantage of the present invention, output stage 138 does not consume power when P1 is a logic ONE. As another advantage of the present invention, during the non-conducting operation of output stage 138, buffer circuit 215, including transistors 205 and 213, and buffer circuit 217, including transistors 212 and 214, serve to prevent the changing voltage appearing at input nodes 142 and 144 from being transmitted to output nodes 146 and 148. Hence, buffer circuits 215 and 217 isolate output nodes 146 and 148 from input nodes 142 and 144, respectively. During dynamic operation, buffer circuit 215 provides a buffer output signal that is an amplified representation of the input signal appearing at node 144. Similarly, during dynamic operation, buffer circuit 217 provides a buffer output signal that is an amplified representation of the input signal appearing at node 142.

Output stage 138 is initialized by shorting output node 148 to output node 146. Control signal P1 is coupled to initialization circuit 219 at the gates of n-channel transistors 206 and 207. When P1 is a logic ONE, transistors 206 and 207 are in an ON state, causing outputs 146 and 148 to be at the same voltage level which, for the present example, is ground. Since outputs 146 and 148 are at the same voltage level, when power is applied to output stage 138, outputs 146 and 148 immediately diverge in response to the voltage differential appearing at input nodes 142 and 144. In another embodiment of the present invention, output stage 138 is initialized by forcing output node 148 and output node 146 to a predetermined voltage. By initiating output nodes 148 and 146 at a predetermined voltage, the speed of output stage 138 is enhanced at the expense of additional current drain.

Looking at further detail of the operation of output stage 138, the application of a logic ONE control signal P1 at the gates of transistors 206 and 207, forces the voltages at nodes 146 and 148 to be equal and at ground potential. As a result the differential drain currents of transistors 204, 211, 203, 209 are forced to be equal. Now, for example, if voltage V+ΔV is applied to node 144, and voltage V−ΔV is applied to node 142, equations (5) through (8) describe the change in drain currents of transistors 204, 211, 203, 209 during regeneration within output stage 138, $$\Delta i_{D204} = -\frac{\Delta V}{r_{ds204}} \tag{5}$$

$$\Delta i_{D211} = +\frac{\Delta V}{r_{ds211}} \tag{6}$$

$$\Delta i_{D203} = +\frac{\Delta V}{r_{ds203}} \tag{7}$$

$$\Delta i_{D209} = -\frac{\Delta V}{r_{ds209}}, \tag{8}$$

where $r_{ds}$ is the drain source resistance of the respective transistor.

The change in current flow into node 148 is given by equation (9), $$\Delta i_{D204} - \Delta i_{D211} = -\frac{\Delta V}{r_{ds204}} - \left(+\frac{\Delta V}{r_{ds211}}\right) \tag{9}$$

and assuming that $r_{ds204}$ is equal to $r_{ds211}$, then in equation (10), $$\Delta i_{D204} - \Delta i_{D211} = -\frac{2\Delta V}{r_{ds}}. \tag{10}$$

Similarly, for the change in current flowing into node 146 is given by equation (11), $$\Delta i_{D203} - \Delta i_{D209} = +\frac{2\Delta V}{r_{ds}}. \tag{11}$$

Since the net current flowing into a node must be equal to zero, the voltage appearing at node 148 changes in a negative direction due to the effect of the current described in equation (10). Likewise the voltage appearing at node 146 changes in a positive direction due to the effect of the current described in equation (11). The increase in voltage at node 146, and at the gates of transistor 211 and transistor 204, causes an increase in the drain current of transistor 211 and a decrease of drain current in transistor 204. Transistors 204 and 211 operate as feedback circuit 230. The gates of transistors 204 and 211 form the input of feedback circuit 230 and receive the increasing voltage signal from node 146. The drains of transistors 204 and 211 form the respective outputs of feedback circuit 230, which drive node 148, with a feedback signal, in a decreasing manner to a lower voltage level. As the voltage level at node 148 is driven lower by feedback circuit 230, the decreasing voltage at node 148 is fed back to the gates of transistor 203 and transistor 209, causing an increase in the drain current of transistor 203 and a decrease in the drain current of transistor 209, and further forcing the voltage at node 146 to continue to rise. Transistors 203 and 209 operate as feedback circuit 240. The gates of transistors 203 and 209 form the input of feedback circuit 240, and receive the decreasing voltage signal from node 148. The drains of transistors 203 and 209 form the respective outputs of feedback circuit 240, which drive node 146, with a feedback signal, in an increasing manner to a higher voltage level. As the voltage level at node 148 is driven lower by feedback circuit 240, a regenerative process is created. As the voltage at node 148 decreases and continues to fall in a regenerative fashion, the voltage at node 146 continues to increase, and continues to rise, likewise in a regenerative fashion.

In the regeneration process of comparator output stage 138, the increase in the voltage at node 146 is a result of positive feedback of the voltage at node 146 applied to the gates of transistors 204 and 211, causing a corresponding fall in the voltage at node 148, causing, in turn, a decrease in the voltage applied to the gates of transistors 203 and 209, thus, regeneratively driving the voltage at node 146 in an increasing direction. The continuing regenerative decrease in the voltage at node 148 is a result of positive feedback of the voltage at node 148 applied to the gates of transistors 203 and 209, causing a corresponding rise in the voltage at node 146, causing, in turn, an increase in the voltage applied to the gates of transistors 204 and 211, thus, further driving the voltage at node 148 in a decreasing direction.

The regenerative action continues in output stage 138 until the voltage at node 146 reaches the positive voltage supply rail and the voltage at node 148 reaches the negative voltage supply rail. When the regenerative action ceases, the signal voltage at nodes 142 and 144 of output stage 138 appears as an amplified signal that is latched at output nodes 146 and 148. Node 148 is latched at the negative voltage supply rail, node 146 is latched at the positive voltage supply rail, and static current flow is zero in output stage 138.

Output stage 138 is re-initialized upon the application of a logic ONE control signal P1 at the gates of transistors 206 and 207 forcing the voltages at nodes 146 and 148 again to be equal. As a result the drain currents of transistors 204, 211, 203, 209 are forced to be equal. Now, for example, if voltage V−ΔV is applied to node 144, and voltage V+ΔV is applied to node 142, the regenerative action proceeds as follows.

The net current into node 148 causes the voltage to change in a positive direction. Likewise the voltage appearing at node 146 changes in a negative direction due to the effect of the net current into node 146. The increase in voltage at node 148, and at the gates of transistor 209 and transistor 203, causes an increase in the drain current of transistor 209 and a decrease of drain current in transistor 203. Transistors 203 and 209 operate as feedback circuit 240. The gates of transistors 203 and 209 form the input of feedback circuit 240 and receive the increasing voltage signal from node 148. The drains of transistors 203 and 209 form the respective outputs of feedback circuit 240, which drive node 146 in a decreasing manner to a lower voltage level. As the voltage level at node 146 is driven lower by feedback circuit 240, the decreasing voltage at node 146 is fed back to the gates of transistor 204 and transistor 211, causing an increase in the drain current of transistor 204 and a decrease in the drain current of transistor 211, and further forcing the voltage at node 148 to continue to rise. Transistors 204 and 211 operate as feedback circuit 230. The gates of transistors 204 and 211 form the input of feedback circuit 230, and receive the decreasing voltage signal from node 146. The drains of transistors 204 and 211 form the respective outputs of feedback circuit 230, which drive node 148 in an increasing manner to a higher voltage level. As the voltage level at node 146 is driven lower by feedback circuit 230, a regenerative process is created. As the voltage at node 146 decreases and continues to fall in a regenerative fashion, the voltage at node 148 continues to increase, and continues to rise, likewise in a regenerative fashion.

In the regeneration process of comparator output stage 138, the increase in the voltage at node 148 is a result of positive feedback of the voltage at node 148 applied to the gates of transistors 203 and 209, causing a corresponding fall in the voltage at node 146, causing, in turn, a decrease in the voltage applied to the gates of transistors 204 and 211, thus, regeneratively driving the voltage at node 148 in an increasing direction. The continuing regenerative decrease in the voltage at node 146 is a result of positive feedback of the voltage at node 146 applied to the gates of transistors 204 and 211, causing a corresponding rise in the voltage at node 148, causing, in turn, an increase in the voltage applied to the gates of transistors 203 and 209, thus, further driving the voltage at node 146 in a decreasing direction.

The regenerative action continues in output stage 138 until the voltage at node 148 reaches the positive voltage supply rail and the voltage at node 146 reaches the negative voltage supply rail. When the regenerative action ceases, the signal voltage at nodes 142 and 144 of output stage 138 appears as an amplified signal that is latches at output nodes 146 and 148. Node 148 is latched at the positive supply rail voltage and node 146 is latched at the negative supply rail voltage.

As an advantage of the present invention, the sensitivity of the amplification of output stage 138 is enhanced through the implementation of regenerative feedback paths that provide large amounts of gain for extremely small input signals. As a further advantage of the present invention, once an input signal is detected at the inputs of output stage 138 and latched at output nodes 146 and 148, zero current flows through output stage 138. Hence, output stage 138 consumes power only when operating in a dynamic mode.

In another embodiment of the present invention, the speed by which an input signal is latched at the outputs of output stage 138 is enhanced by providing additional gain from node 146 to node 148 and from node 148 to node 146. Referring again to FIG. 10, gain element 220 and gain element 222 are shown. Gain element 220 is configured as a CMOS inverter with the gates of transistors 201 and 210 coupled to output node 146 to provide added feedback gain to buffer output node 146. The drains of transistors 201 and 210 are coupled to output node 148. Gain element 220 has a gain of less than minus one and is configured as to add gain to buffer output node 148. Gain element 222 is configured as a CMOS inverter with the gates of transistors 202 and 208 coupled to output node 148 to provide added feedback gain to output node 148. The drains of transistors 202 and 208 are coupled to output node 146. Gain element 222 has a gain of less than minus one and is configured as to add gain to node 146.

Gain element 220 is configured with the source and gate of transistor 201 coupled respectively to the source and gate of transistor 204. Likewise, the source and gate of transistor 210 are coupled respectively to the source and gate of transistor 211. Gain element 220 consumes power only when output stage 138 is operating in a dynamic mode.

Gain element 222 is configured with the source and gate of transistor 202 coupled respectively to the source and gate of transistor 203. Likewise, the source and gate of transistor 208 are coupled respectively to the source and gate of transistor 209. Gain element 222 consumes power only when output stage 138 is operating in a dynamic mode. Thus, as another advantage of the present invention, the speed of output stage 138 is enhanced through the addition of zero static current drain gain elements.

By now it can be appreciated that the comparator of the present invention provides a minimal component circuit for comparing an input signal to a reference signal. The comparator subtracts the input signal from the reference signal and amplifies the difference. The comparator uses a regenerative circuit in a high speed latching output stage to transfer the compared signal to a latch circuit. The output stage consumes power only when processing the compared signal. The output stage also buffers the compared signal from a new incoming signal to maintain the integrity of the compared signal for further processing at the latch circuit output.

Figure 11:
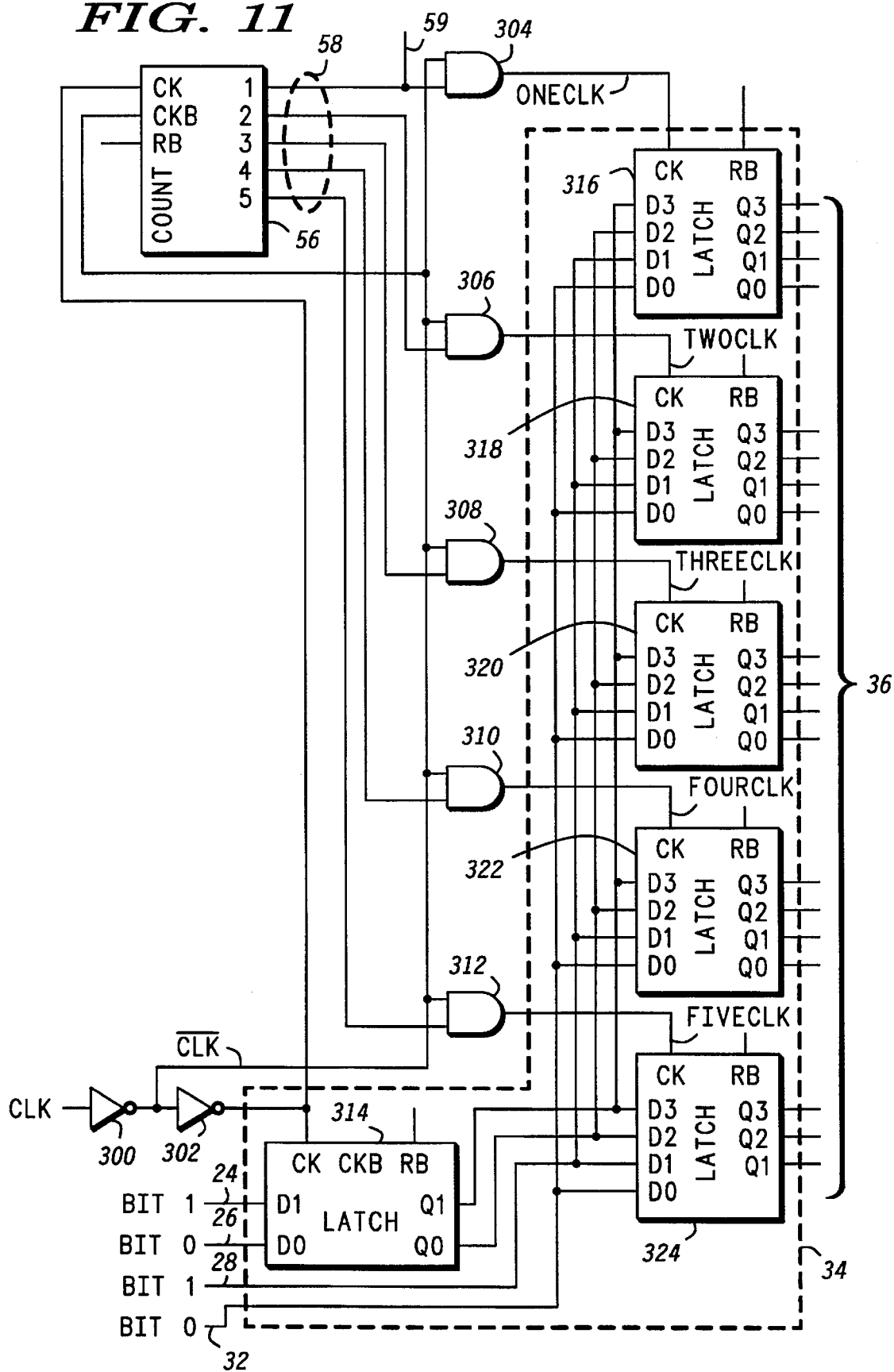
FIG. 11 is a schematic and block diagram illustrating further detail of the storage element of the redundant signed digit analog-to-digital converter of FIG. 1.

Referring now to FIG. 11, further detail of a portion of logic circuit 40 is presented for a ten-bit analog-to-digital converter. Data signals BIT1 and BIT0 from first RSD stage 18 comparators 72 and 74, respectively, are input to data (D) inputs of latch circuit 314. Data signals BIT1 and BIT0 from second RSD stage 30 comparators 84 and 86, respectively, are input to data (D) inputs of latch circuits 316, 318, 320, 322, and 324. Storage element 34 includes latch circuits 316, 318, 320, 322, 324, and 314.

Latch circuit 316 includes four D-latches having inputs D0, D1, D2, and D3, respectively, and four outputs Q0, Q1, Q2, and Q3, respectively. Data-latch 316 is clocked by a signal generated by AND gate 304 operating on the master clock signal $\overline{CLK}$ and the first bit output of counter 56. The master clock signal $\overline{CLK}$ is the master clock signal CLK inverted by inverter 300. Latch circuit 318 includes four D-latches having inputs D0, D1, D2, and D3, respectively, and four outputs Q0, Q1, Q2, and Q3, respectively. Data-latch 318 is clocked by a signal generated by AND gate 306 operating on the master clock signal $\overline{CLK}$ and the second bit output of counter 56. Storage element 34 includes latch circuits 316, 318, 320, 322, 324, and 314. Latch circuit 320 includes four D-latches having inputs D0, D1, D2, and D3, respectively, and four outputs Q0, Q1, Q2, and Q3, respectively. D-latch 320 is clocked by a signal generated by AND gate 308 operating on the master clock signal $\overline{CLK}$ and the third bit output of counter 56. Latch circuit 322 includes four D-latches having inputs D0, D1, D2, and D3, respectively, and four outputs Q0, Q1, Q2, and Q3, respectively. D-latch 322 is clocked by a signal generated by AND gate 310 operating on the master clock signal $\overline{CLK}$ and the fourth bit output of counter 56. Latch circuit 324 includes four D-latches having inputs D0, D1, D2, and D3, respectively, and four outputs Q0, Q1, Q2, and Q3, respectively. D-latch 324 is clocked by a signal generated by AND gate 312 operating on the master clock signal $\overline{CLK}$ and the fifth bit output of counter 56. Latch circuit 314 includes two D-latches having inputs D0 and D1, respectively, and two outputs Q0 and Q1, respectively. D-latch 314 is clocked by master clock signal CLK from inverter 302.

The circuit of FIG. 11 functions as follows. BIT0 and BIT1 data signals from first RSD stage 18 are input to D0 and D1 inputs, respectively, of latch circuit 314 on a first clock CLK pulse. Latch circuit 314 provides a time delay to permit second RSD stage 30 to process the signal received from RSD stage 18 so that BIT0 and BIT1 from RSD stage 18 and BIT0 and BIT1 of RSD stage 30 are input to latch circuits 316, 318, 320, 322, and 324 in proper sequence. Next, the first bit of counter 56 is ANDed with $\overline{CLK}$ to clock BIT0 and BIT1 from RSD stage 18 and BIT0 and BIT1 of RSD stage 30 data into the respective D-latches of latch circuit 316. The corresponding BIT0 and BIT1 from RSD stage 18 and BIT0 and BIT1 of RSD stage 30 data are latched at the respective D-latch outputs of latch circuits 316. The output of RSD stage 30 is fed back to the input of RSD stage 18 to initiate a second cycle of the analog-to-digital conversion. BIT0 and BIT1 from RSD stage 18 and BIT0 and BIT1 of RSD stage 30 are latched into D-latches of latch circuit 318 on the second master clock cycle. The process continues for successive cycles of master clock CLK, until latch circuits 316, 318, 320, 322, and 324 are filled with the appropriate data from analog section 70. Thus, the digital representation, of the analog input voltage that is to be converted, is processed in a pipelined fashion. The timing relationships of ONECLK, TWOCLK, THREECLK, FOURCLK, and FIVECLK signals, used to clock latch circuits, 316, 318, 320, 322, and 324, are found in timing diagram 65 of FIG. 3. Thus, during the analog-to-digital conversion process, the input of data signals to storage element 34 is synchronized master clock CLK and counter 56 output signals.

Figure 12:
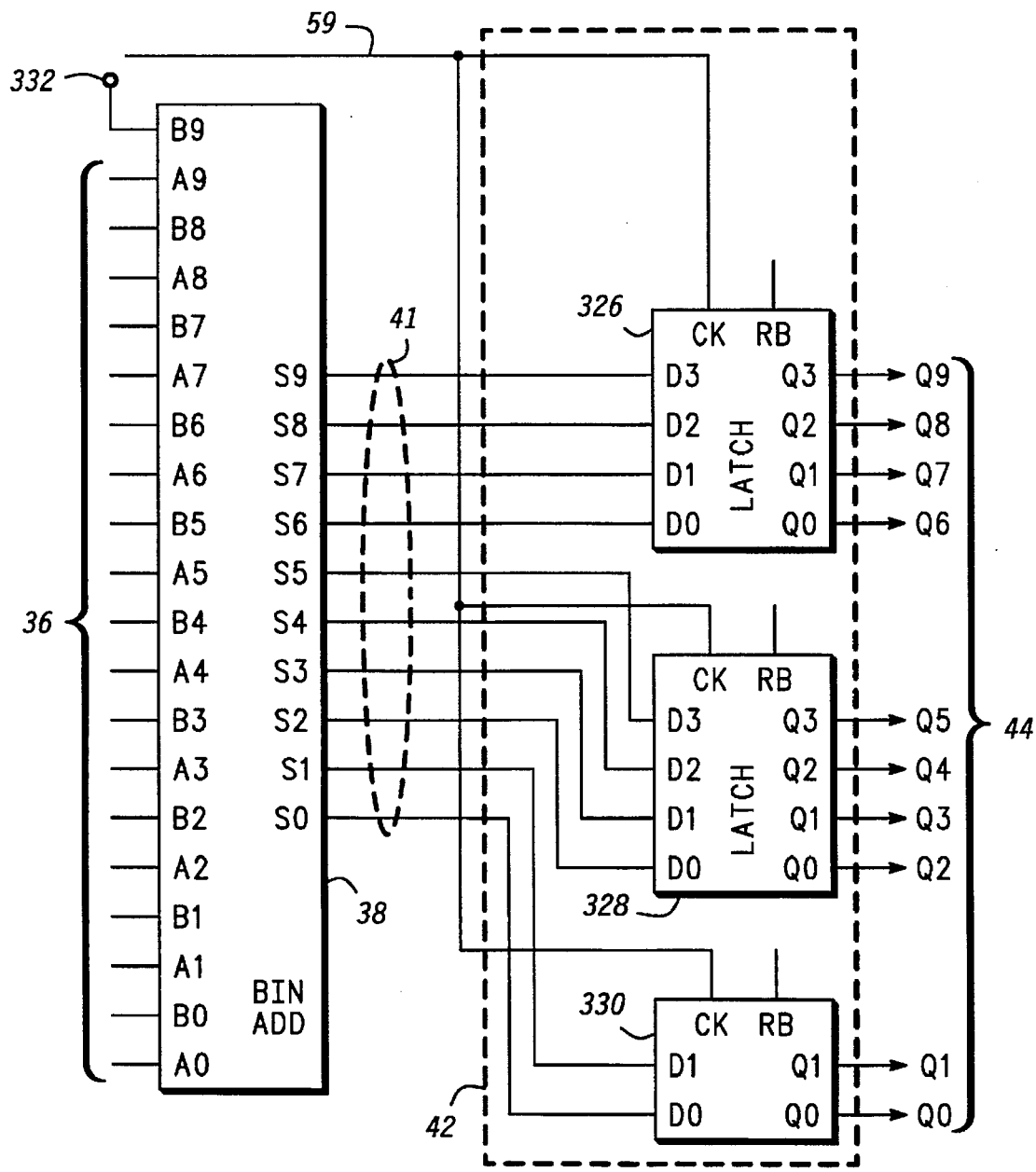
FIG. 12 is a schematic and block diagram illustrating further detail of the binary adder and output latch circuits of the redundant signed digit analog-to-digital converter of FIG. 1.

Looking now to FIG. 12, further detail of a portion of logic circuit 40 is presented for a ten-bit analog-to-digital converter. Binary adder 38 receives signals 36 from storage element 34 and provides output signals 41 to output latch circuits 42. The Q3, Q2, Q1, and Q0 outputs of D-latch 316 are input into A9, B8, A8, and B7 inputs, respectively of binary adder 38. The Q3, Q2, Q1, and Q0 outputs of D-latch 318 are input into A7, B6, A6, and B5 inputs, respectively of binary adder 38. The Q3, Q2, Q1, and Q0 outputs of D-latch 320 are input into A5, B4, A4, and B3 inputs, respectively of binary adder 38. The Q3, Q2, Q1, and Q0 outputs of D-latch 322 are input into A3, B2, A2, and B1 inputs, respectively of binary adder 38. The Q3, Q2, and Q1 outputs of D-latch 324 are input into A1, B0, and A0 inputs, respectively of binary adder 38. Input B9 at node 332 and the first carry-in input (not shown) of binary adder 38 are coupled to ground potential to provide proper decoding of the data latched in storage element 34. Binary adder 38 combines output signals 36 into proper format for a ten-bit representation of the analog input voltage signal VIN that was presented at node 12 of analog-to-digital converter 10. Outputs S9, S8, S7, and S6 of binary adder 38 are coupled, respectively, to the D3, D2, D1, and D0 inputs of latch 330. Outputs S5, S4, S3, and S2 of binary adder 38 are coupled, respectively, to the D3, D2, D1, and D0 inputs of latch 328. Outputs S1 and S0 of binary adder 38 are coupled, respectively, to the D1 and D0 inputs of latch 330. Outputs 41 of binary adder 38 are clocked into output latch circuits 42 during the first bit output from counter 56 at node 59. The data latched into output latch circuits 42 is output through Q0 through Q9 output lines 44 to complete the analog-to-digital conversion process.

In an alternate embodiment of the present invention, latch circuits 316, 318, 320, 322, 324, 326, 328, 330, and 314 are provided with a RESET input to utilize a system reset pulse (not shown) to initialize analog-to-digital converter 10.

By now it can be appreciated that logic circuit 40 synchronizes, stores, and aligns the bits received from analog circuitry of an RSD analog-to-digital converter. The bits are processed, in pipeline fashion, using a binary adder for recombination into an accurate digital representation of the analog input voltage that was input into the RSD stages. As an advantage of the present invention, the pipelined digital structure provides for enhanced speed of the conversion process while using minimal digital circuitry to implement the analog-to-digital conversion.

An example of a four-bit single-ended analog-to-digital conversion is implemented as follows. The input range of the analog voltage to be converted is −2.0 volts to +2.0 volts. Positive reference voltage +VREF is selected to be 2.0 volts and negative reference voltage −VREF is selected to be −2.0 volts. For the RSD analog-to-digital conversion process, single-ended reference voltage VH is selected to be one-third of the positive reference voltage and single-ended reference voltage VL is selected to be one-third of the negative reference voltage. Hence, VH is +0.6666 volts and VL is −0.6666 volts. Since a four-bit conversion is to be performed, logic circuit 40 is structured as follows. Storage element 34 includes 2n, i.e., eight storage latches. Binary adder 38 is a 2n, i.e., eight-bit adder. Output latch circuits 42 include n, i.e., four latches.

Assuming that the input voltage VIN of the first voltage sampled is −0.8234 volts, VIN is compared to reference voltage VH and to reference voltage VL in RSD stage 18. The voltage −0.8234 volts is multiplied by a factor of two in multiplier 76, and the resultant voltage, −1.6468 volts is input to summing circuit 78. Since −0.8234 volts is less than reference voltage VL, BIT1 and BIT0 are both set to a logic ZERO at the nodes 24 and 26, respectively and latched into storage element 34. Referring back to table 170 of FIG. 6, when VIN is less than VL, switch 80 is open and switch 82 is closed, causing voltage +VREF to be input to summing circuit 78. The output of summing circuit 78, at node 22, is +0.3532 volts, the residue voltage V22 of RSD stage 18.

A residue voltage V22, +0.3532 volts is input to RSD stage 30. The voltage +0.3532 volts is multiplied by a factor of two in multiplier 76, and the resultant voltage, +0.7064 volts is input to summing circuit 78. Since residue voltage V22, i.e., +0.3532 volts, lies between reference voltage VL and reference voltage VH, BIT1 is set to a logic ZERO and BIT0 is set to a logic ONE at the nodes 28 and 32, respectively and latched into storage element 34. Thus, the first two bits of the analog-to-digital conversion are represented by four bits in storage element 34. The bit pattern in storage element 34 is "0001". Referring back to table 172 of FIG. 8, when V22 is greater than VL but less than VH, switch 90 is open and switch 92 is open. Thus, the residue voltage V14, of summing circuit 78, at node 14, is 2 times +0.3532 volts, i.e., +0.7064 volts.

During the next phase of conversion, counter 56 directs switch controller 46 to connect the feedback path, of analog section 70, through nodes 13 and 16 of input switch 20. A residue voltage V14 of +0.7064 volts, is input to RSD stage 18. The residue voltage V14 is compared to reference voltage VH and to reference voltage VL in RSD stage 18. The voltage +0.7064 volts is multiplied by a factor of two in multiplier 76, and the resultant voltage, +1.4128 volts is input to summing circuit 78. Since the voltage +0.7064 volts is greater than reference voltage VH and likewise greater than reference voltage VL, BIT1 is set to a logic ONE and BIT0 is set to a logic ZERO at the nodes 24 and 26, respectively, and latched into storage element 34. Referring back to table 170 of FIG. 6, when VIN is greater than VH, switch 80 is closed and switch 82 is open, causing voltage −VREF to be input to summing circuit 78. Thus, the output of summing circuit 78, at node 22, is −0.5872 volts, the residue voltage V22 of RSD stage 18. The voltage −0.5872 volts is now compared to VMID for the lsb conversion bit. Switch 96 is opened by control signal SWMSB and switch 94 is closed by control signal SWLSB to apply VMID, i.e., 0.00 volts to the positive input of comparator 84. Since −0.5872 volts is less than VMID, BIT1 of logic circuit 83 transitions to a logic zero state. Thus, the last two bit conversions are represented in storage element 34 as "100", and the digital representation of the voltage −0.8234 volts is represented in storage element 34 as "0001100", with the lsb being the rightmost bit. A binary addition of the bits of "0001100" is performed in binary adder 38, beginning with the two rightmost bits. The resulting digital code is "0100"

and represents the voltage −0.8234 volts. The digital code "0100" is transferred and stored in output latch circuits 42. The output of output latch circuits 42 provides digital code "0100" on output lines 44.

Figure 13:
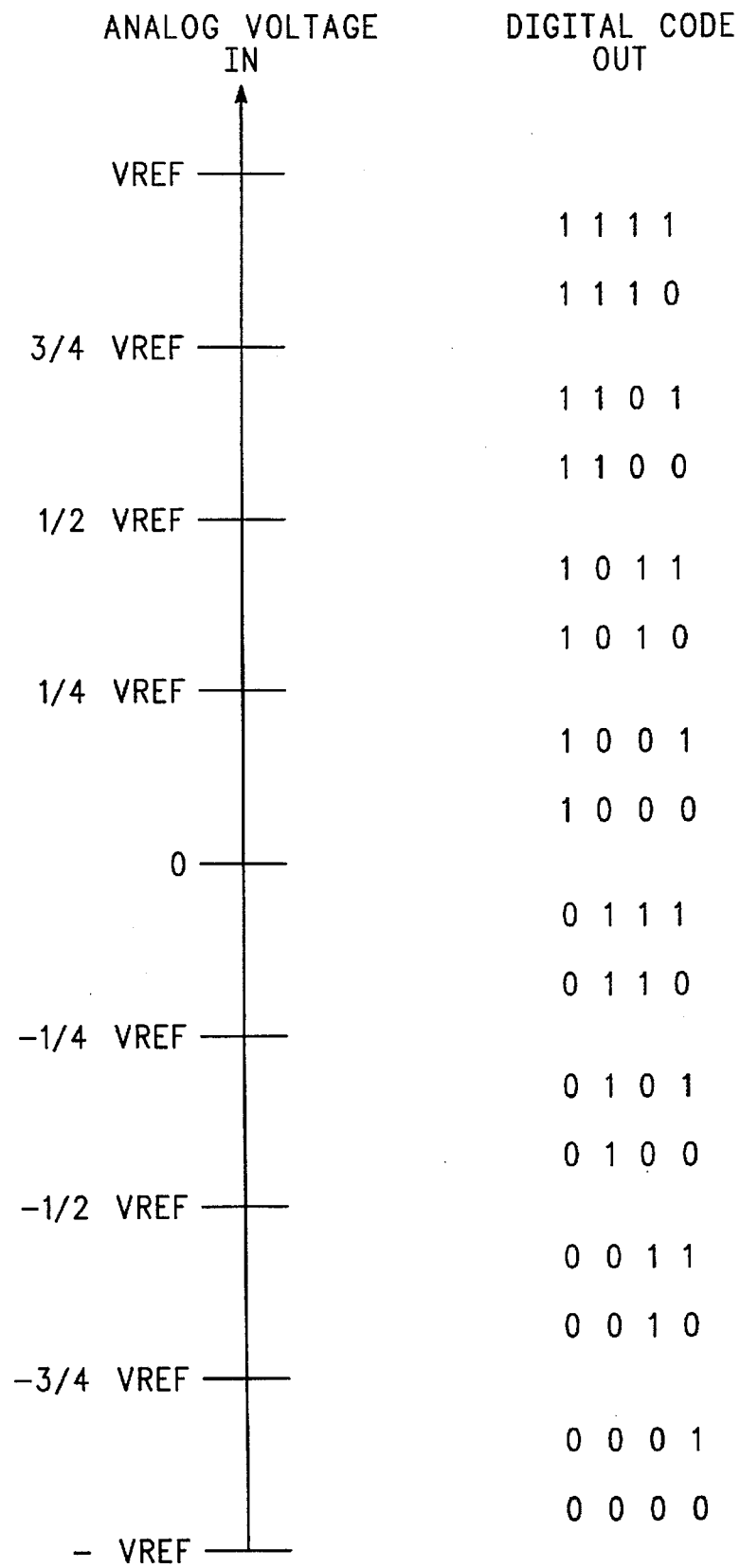
FIG. 13 is a table illustrating the digital codes for a four bit redundant signed digit analog-to-digital converter.

Referring to FIG. 13, table 335 illustrates the digital output codes that are representative of the analog input voltages. For the previous example, −0.8234 volts, the digital code is 0100. Digital code 0100 resides between the voltages −¼ VREF and −½ VREF, i.e., −0.5000 volts and −1.000 volts, respectively.

Thus, it can now be fully appreciated that the present invention provides a circuit and method for redundant signed digit (RSD) analog-to-digital conversion that samples an analog input voltage VIN and compares the analog input voltage to a high level voltage reference and to a low level voltage reference in a first RSD stage. In processing a most significant bit (msb), if the analog input voltage lies between the high level and low level voltage references, residue voltage 2*VIN is generated and passed to a second RSD stage. First and second data bits are set at outputs of the first RSD stage that are representative of the analog input voltage.

If the analog input voltage VIN, coupled to the first RSD stage, is greater than the high level voltage reference, a residue voltage is generated that is 2*VIN less a third reference voltage. First and second data bits are set at outputs of the first RSD stage that are representative of the analog input voltage.

If the analog input voltage VIN, coupled to the first RSD stage, is less than the low level voltage reference, a residue voltage is generated that is 2*VIN plus a third reference voltage. First and second data bits are set at outputs of the first RSD stage that are representative of the analog input voltage.

If the analog input voltage VIN, coupled to the first RSD stage, lies between the low level voltage reference and the high level voltage reference, a residue voltage 2*VIN is generated. First and second data bits are set at the outputs of the first RSD stage that are representative of the analog input voltage.

The residue voltage V22 generated at the output of the first RSD stage is coupled to the input of the second RSD stage and is compared to high level and low level voltage references in the second RSD stage. If the residue voltage V22 lies between the high level and low level voltage references, a second residue voltage 2*V22 is generated at an output of the second RSD stage, and first and second data bits are set at additional outputs of the second RSD stage that are representative of the residue voltage V22. If the residue voltage V22, coupled to the second RSD stage, is greater than the high level voltage reference, a second residue voltage is generated at an output of the second RSD stage that is 2*V22 less a third reference voltage. First and second data bits are set at additional outputs of the second RSD stage that are representative of the residue voltage V22. If the residue voltage V22, coupled to the second RSD stage, is less than the low level voltage reference, a second residue voltage is generated at an output of the second RSD stage that is 2*V22 plus a third reference voltage. First and second data bits are set at additional outputs of the second RSD stage that are representative of the residue voltage V22.

The second residue voltage is recycled through the first and second RSD stages, and the resulting residue voltage is again recycled until the predetermined least significant bit lsb conversion is reached at the second RSD stage. For the lsb conversion in the second RSD stage, the high level reference voltage comparison is uncoupled and the low level voltage reference comparison is ignored. The residue voltage input for the lsb conversion is compared to a third reference level in the second RSD stage. If the residue voltage input for the lsb conversion is greater than the third reference level, a data bit at the output of the second RSD stage is set at a first predetermined level. If the lsb residue voltage input is less than the third reference level, the data bit at the output of the second RSD stage is set at a second predetermined level.

The data bits at the outputs of the first and second RSD stages are loaded into storage elements in a synchronized manner and are transferred from the outputs of the storage elements to a binary adder. The data bits are added in the binary adder and the outputs of the binary adder are loaded into output latch circuits. The outputs of the output latch circuits are a digital representation of the analog input voltage VIN, that was processed by the RSD analog-to-digital converter.

Hence, an RSD n-bit analog-to-digital converter has been presented that receives an input voltage and compares the input voltage to high level and low level reference voltages in a first stage. A digital code, representing the input voltage, is generated at the first stage outputs A first stage residue voltage is compared to high level and low level reference voltages in a second stage. A digital code generated at the outputs of the second stage, represent the first stage residue voltage. The first stage residue voltage is recycled through the first and second stages of the converter. Upon reaching the $n^{th}$ conversion bit, the residue voltage of the $n^{th}-1$ bit is compared to a second stage mid-level voltage reference. A digital code generated at the outputs of the second stage represents the $n^{th}-1$ bit residue voltage. The digital codes from the first and second stages are stored in storage elements and added in a binary adder to provide an n-bit representation of the input voltage. Thus, as an advantage of the present invention, the accuracy of the analog-to-digital conversion is greatly enhanced.

While specific embodiments of the present invention have been shown and described, further modifications and improvements will occur to those skilled in the art. It is understood that the invention is not limited to the particular forms shown and it is intended for the appended claims to cover all modifications which do not depart from the spirit and scope of this invention.

What is claimed is:

1. A method of redundant signed digit analog-to-digital conversion in first and second RSD stages, comprising the steps of:
   (a) sampling an analog voltage;
   (b) comparing said analog voltage to first and second reference voltages in the first RSD stage;
   (c) generating a first digital code representative of said analog voltage in the first RSD stage;
   (d) generating a first residue voltage from said analog voltage in the first RSD stage;
   (e) comparing said first residue voltage to a third reference voltage for a least significant bit conversion in the second RSD stage; and
   (f) generating a second digital code representative of said first residue voltage in the second RSD stage.

2. The method of redundant signed digit analog-to-digital conversion, of claim 1, further including the step of comparing said first residue voltage to said first and said second reference voltages for a most significant bit conversion.

3. The method of redundant signed digit analog-to-digital conversion, of claim 2, further including the step of generating a second residue voltage from said first residue voltage.

4. The method of redundant signed digit analog-to-digital conversion, of claim 3, further including the steps of:
   (a) sampling said second residue voltage; and
   (b) comparing said second residue voltage to said first and said second reference voltages for a most significant bit conversion.

5. The method of redundant signed digit analog-to-digital conversion, of claim 4, further including the step of storing said first and said second digital codes in a storage element.

6. The method of redundant signed digit analog-to-digital conversion, of claim 5, further including the steps of:
   performing a binary addition of said first digital code; and
   performing a binary addition of said second digital code.

7. A redundant signed digit analog-to-digital converter, comprising:
   a first stage having an input coupled for receiving a first input voltage at a first terminal, a first output for providing a first residue voltage, and second and third outputs for providing a first and second data signals, respectively, that are a first digital representation of said first input voltage;
   a second stage having an input coupled for receiving said first residue voltage, a first output for providing a second residue voltage, and second and third outputs for providing third and fourth data signals, respectively, that are a digital representation of said first residue voltage;
   a second terminal coupled for receiving said second residue voltage;
   a first switch, responsive to a first control signal, coupled at said input of said first stage for switching between said first terminal for receiving said first input voltage, and said second terminal for providing cyclic processing of said second residue voltage;
   a storage element having first and second inputs coupled, respectively, to said second and said third outputs of said first stage, having third and fourth inputs coupled, respectively, to said second and said third outputs of said second stage, and having a plurality of outputs; and
   a binary adder having first, second, third, and fourth inputs coupled, respectively, to first, second, third, and fourth outputs of said plurality of outputs of said storage element, and having first and second outputs for providing a second digital representation of said first input voltage.

8. The redundant signed digit analog-to-digital converter of claim 7, further comprising an output latch circuit having first and second inputs coupled, respectively, to said first and said second outputs of said binary adder, and having first and second outputs for storing said second digital representation of said first input voltage.

9. The redundant signed digit analog-to-digital converter of claim 8, wherein said second stage includes:
   a first comparator having a first input coupled to a third terminal for receiving a first reference voltage and for providing a most significant bit conversion comparison, said first input further coupled to a fourth terminal for receiving a second reference voltage and for providing a least significant bit conversion comparison, and having a second input coupled to said first terminal, and having an output for providing a first digital representation of said first input voltage; and
   a second comparator having a first input coupled to a fifth terminal for receiving a third reference voltage for providing a most significant bit conversion comparison, and having a second input coupled to said first terminal, and having an output for providing a second digital representation of said first input voltage.

10. A redundant signed digit (RSD) analog-digital converter, comprising:

a first switching circuit having a first terminal coupled for receiving an input voltage, said first switching circuit operating in response to a control signal for connecting said first terminal to a second terminal and for connecting said second terminal to a third terminal;

a first RSD stage having an input coupled to said second terminal of said first switching circuit, a first output for providing a first residue voltage, and second and third outputs for providing first and second data signals, respectively, as a digital representation of a signal applied to said input of said first RSD stage, said first RSD stage including,
 (a) a first comparator having a first input coupled to said input of said first RSD stage and a second input coupled for receiving a first reference voltage,
 (b) a second comparator having a first input coupled to said input of said first RSD stage and a second input coupled for receiving a second reference voltage,
 (c) a first logic circuit having a first input coupled to an output of said first comparator, a second input coupled to an output of said second comparator, and first and second outputs for providing said first and second data signals, respectively,
 (d) a first multiplier having an input coupled to said input of said first RSD stage,
 (e) a first summing circuit having a first input coupled to an output of said first multiplier, and
 (f) a second switching circuit having a first terminal coupled for receiving a third reference voltage, a second terminal coupled to a second input of said first summing circuit, and a control input coupled for receiving a first control signal from said first logic circuit; and a second RSD stage having an input coupled to said first output of said first RSD stage, a first output for providing a second residue voltage to said third terminal of said first switching circuit, and second and third outputs for providing third and fourth data signals, respectively, as a digital representation of said first residue voltage.

11. The RSD analog-digital converter of claim 10 wherein said first RSD stage further includes a third switching circuit having a first terminal coupled for receiving a fourth reference voltage, a second terminal coupled to a third input of said first summing circuit, and a control input coupled for receiving a second control signal from said first logic circuit.

12. The RSD analog-digital converter of claim 10 wherein said second RSD stage includes:

a third comparator having a first input coupled to said input of said second RSD stage and a second input coupled for receiving the first reference voltage;

a fourth comparator having a first input coupled to said input of said second RSD stage;

a third switching circuit having a first terminal coupled for receiving the second reference voltage and a second terminal coupled to a second input of said fourth comparator;

a fourth switching circuit having a first terminal coupled for receiving a fourth reference voltage and a second terminal coupled to the second input of said fourth comparator; and a second logic circuit having a first input coupled to an output of said third comparator, a second input coupled to an output of said fourth comparator, and first and second outputs for providing said third and fourth data signals, respectively.

13. The RSD analog-digital converter of claim 12 wherein said second RSD stage further includes:

a second multiplier having an input coupled to said input of said second RSD stage;

a second summing circuit having a first input coupled to an output of said second multiplier;

a fifth switching circuit having a first terminal coupled for receiving a fourth reference voltage, a second terminal coupled to a second input of said second summing circuit, and a control input coupled for receiving a first control signal from said second logic circuit; and a sixth switching circuit having a first terminal coupled for receiving a fifth reference voltage, a second terminal coupled to a third input of said second summing circuit, and a control input coupled for receiving a second control signal from said second logic circuit.

14. The RSD analog-digital converter of claim 10 further including:

a first latch having first and second inputs coupled for receiving said first and second data signals from said first RSD stage;

a second latch having first and second inputs coupled for receiving said third and fourth data signals from said second RSD stage, and third and fourth inputs coupled to first an outputs ofoutputs of said first latch; and a third latch having first and second inputs coupled for receiving said third and fourth data signals from said second RSD stage, and third and fourth inputs coupled to said first and second outputs of said first latch.

15. The RSD analog-digital converter of claim 14 further including:

a binary adder having a plurality of inputs respectively coupled to a plurality of outputs of said second and third latches; and an output latch having a plurality of inputs coupled to a plurality of outputs of said binary adder, said output latch providing a digital representation of said input signal.

16. A redundant signed digit (RSD) analog-digital converter, comprising:

a first switching circuit having a first terminal coupled for receiving an input voltage, said first switching circuit operating in response to a control signal for connecting said first terminal to a second terminal and for connecting said second terminal to a third terminal;

a first RSD stage having an input coupled to said second terminal of said first switching circuit, a first output for providing a first residue voltage, and second and third outputs for providing first and second data signals, respectively, as a digital representation of a signal applied to said input of said first RSD stage; and a second RSD stage having an input coupled to said first output of said first RSD stage, a first output for providing a second residue voltage to said third terminal of said first switching circuit, and second and third outputs for providing third and fourth data signals, respectively, as a digital representation of said first residue voltage.

17. The RSD analog-digital converter of claim 16 wherein said first RSD stage further includes:

a first comparator having a first input coupled to said input of said first RSD stage and a second input coupled for receiving a first reference voltage;

a second comparator having a first input coupled to said input of said first RSD stage and a second input coupled for receiving a second reference voltage; and a logic circuit having a first input coupled to an output of said first comparator, a second input coupled to an output of said second comparator, and first and second outputs for providing said first and second data signals, respectively.

18. The RSD analog-digital converter of claim 17 wherein said first RSD stage further includes:

a multiplier having an input coupled to input of said first RSD stage;

a summing circuit having a first input coupled to an output of said multiplier;

a second switching circuit having a first terminal coupled for receiving a third reference voltage, a second terminal coupled to a second input of said summing circuit, and a control input coupled for receiving a first control signal from said logic circuit; and a third switching circuit having a first terminal coupled for receiving a fourth reference voltage, a second terminal coupled to a third input of said summing circuit, and a control input coupled for receiving a second control signal from said logic circuit.

19. The RSD analog-digital converter of claim 16 wherein said second RSD stage includes:

a first comparator having a first input coupled to said input of said second RSD stage and a second input coupled for receiving a first reference voltage;

a second comparator having a first input coupled to said input of said first RSD stage;

a second switching circuit having a first terminal coupled for receiving a second reference voltage and a second terminal coupled to a second input of said second comparator;

a third switching circuit having a first terminal coupled for receiving a third reference voltage and a second terminal coupled to said second input of said second comparator; and a logic circuit having a first input coupled to an output of said first comparator, a second input coupled to an output of said second comparator, and first and second outputs for providing said third and fourth data signals, respectively.

20. The RSD analog-digital converter of claim 19 wherein said second RSD stage further includes:

a multiplier having an input coupled to said input of said second RSD stage;

a summing circuit having a first input coupled to an output of said multiplier;

a fourth switching circuit having a first terminal coupled for receiving a fourth reference voltage, a second terminal coupled to a second input of said summing circuit, and a control input coupled for receiving a first control signal from said logic circuit; and a fifth switching circuit having a first terminal coupled for receiving a fifth reference voltage, a second terminal coupled to a third input of said summing circuit, and a control input coupled for receiving a second control signal from said logic circuit.

21. The RSD analog-digital converter of claim 16 further including:

a first latch having first and second inputs coupled for receiving said first and second data signals from said first RSD stage;

a second latch having first and second inputs coupled for receiving said third and fourth data signals from said second RSD stage, and third and fourth inputs coupled to first and second outputs of said first latch; and a third latch having first and second inputs coupled for receiving said third and fourth data signals from said second RSD stage, and third and fourth inputs coupled to said first and second outputs of said first latch.

22. The RSD analog-digital converter of claim 21 further including:

a binary adder having a plurality of inputs respectively coupled to a plurality of outputs of said second and third latches; and an output latch having a plurality of inputs coupled to a plurality of outputs of said binary adder, said output latch providing a digital representation of said input signal.

* * * * *

UNITED STATES PATENT AND TRADEMARK OFFICE
CERTIFICATE OF CORRECTION

PATENT NO. : 5,644,313
DATED : July 1, 1997
INVENTOR(S) : Patrick L. Rakers
Douglas A. Garrity It is certified that error appears in the above-indentified patent and that said Letters Patent is hereby corrected as shown below:

Claim 14, column 22, line 28
Delete "an" and insert --and second-- therefor.
Delete "ofoutputs".

Signed and Sealed this

Twenty-first Day of October 1997

Attest:

BRUCE LEHMAN

Attesting Officer

Commissioner of Patents and Trademarks